United States Patent
Tsukao et al.

(10) Patent No.: US 11,309,270 B2
(45) Date of Patent: Apr. 19, 2022

(54) ANISOTROPIC CONDUCTIVE FILM AND PRODUCTION METHOD OF THE SAME

(71) Applicant: DEXERIALS CORPORATION, Tokyo (JP)

(72) Inventors: Reiji Tsukao, Utsunomiya (JP); Yasushi Akutsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/115,771

(22) PCT Filed: Feb. 4, 2015

(86) PCT No.: PCT/JP2015/053060
§ 371 (c)(1),
(2) Date: Aug. 1, 2016

(87) PCT Pub. No.: WO2015/119136
PCT Pub. Date: Aug. 13, 2015

(65) Prior Publication Data
US 2017/0012014 A1   Jan. 12, 2017

(30) Foreign Application Priority Data

Feb. 4, 2014 (JP) .............................. JP2014-019861
Feb. 4, 2014 (JP) .............................. JP2014-019868

(51) Int. Cl.
*H01L 23/00* (2006.01)
*B32B 5/30* (2006.01)
(Continued)

(52) U.S. Cl.
CPC ................ *H01L 24/27* (2013.01); *B32B 3/00* (2013.01); *B32B 3/30* (2013.01); *B32B 5/30* (2013.01);
(Continued)

(58) Field of Classification Search
CPC . C09J 4/00; C09J 163/00; C09J 201/00; C09J 7/00; C09J 2433/00; C09J 2205/102;
(Continued)

(56) References Cited

U.S. PATENT DOCUMENTS 6,020,059 A * 2/2000 Yamada ..................... C09J 9/02
428/328
2006/0280912 A1* 12/2006 Liang ....................... H01B 1/22
428/173

(Continued)

FOREIGN PATENT DOCUMENTS

JP   2001-052778 A   2/2001
JP   2002-327155 A   11/2002
(Continued)

OTHER PUBLICATIONS

Oct. 3, 2017 Office Action issued in Japanese Patent Application No. 2014-019861.
(Continued)

*Primary Examiner* — Nathan L Van Sell
(74) *Attorney, Agent, or Firm* — Oliff PLC

(57) ABSTRACT

An anisotropic conductive film has first and second connection layers formed on a first layer surface. The first connection layer is a photopolymerized resin layer, and the second is thermo- or photo-cationically, anionically, or radically polymerizable resin layer. On the surface of the first connection layer on a second connection layer side, conductive particles for anisotropic conductive connection are in a single layer. The first connection layer has fine projections and recesses in a surface. An anisotropic conductive film of another aspect has first, second, and third connection layers layered in sequence. The first layer formed of photo-radically polymerized resin. The second and third layers are formed of thermo-cationically or thermo-anionically polymerizable resin, photo-cationically or photo-anionically (Continued)

polymerizable resin, thermo-radically polymerizable resin, or photo-radically polymerizable resin. On a surface of the first connection layer on a second connection layer side, conductive particles for anisotropic conductive connection are in a single layer.

12 Claims, 10 Drawing Sheets

(51) Int. Cl.

| | | |
|---|---|---|
| B32B 27/06 | (2006.01) | |
| B32B 3/30 | (2006.01) | |
| B32B 7/04 | (2019.01) | |
| B32B 27/28 | (2006.01) | |
| C09J 4/00 | (2006.01) | |
| B32B 7/02 | (2019.01) | |
| H05K 3/32 | (2006.01) | |
| C09J 163/00 | (2006.01) | |
| C09J 201/00 | (2006.01) | |
| B32B 7/00 | (2019.01) | |
| B32B 3/00 | (2006.01) | |
| B32B 27/00 | (2006.01) | |
| H01R 4/04 | (2006.01) | |
| B32B 27/08 | (2006.01) | |
| C08L 63/00 | (2006.01) | |
| C09J 7/10 | (2018.01) | |

(52) U.S. Cl.
CPC .................. *B32B 7/00* (2013.01); *B32B 7/02* (2013.01); *B32B 7/04* (2013.01); *B32B 27/00* (2013.01); *B32B 27/06* (2013.01); *B32B 27/08* (2013.01); *B32B 27/28* (2013.01); *C08L 63/00* (2013.01); *C09J 4/00* (2013.01); *C09J 7/10* (2018.01); *C09J 163/00* (2013.01); *C09J 201/00* (2013.01); *H01L 24/29* (2013.01); *H01R 4/04* (2013.01); *H05K 3/323* (2013.01); *B32B 2307/20* (2013.01); *B32B 2307/202* (2013.01); *B32B 2307/30* (2013.01); *B32B 2307/302* (2013.01); *B32B 2307/706* (2013.01); *C08K 2201/001* (2013.01); *C09J 2203/326* (2013.01); *C09J 2301/204* (2020.08); *C09J 2301/208* (2020.08); *C09J 2301/314* (2020.08); *C09J 2301/408* (2020.08); *C09J 2433/00* (2013.01); *C09J 2463/00* (2013.01); *H01L 2224/27001* (2013.01); *H01L 2224/2929* (2013.01); *H01L 2224/29298* (2013.01); *H01L 2224/32225* (2013.01); *H01L 2224/83101* (2013.01); *H01L 2224/83851* (2013.01); *H01L 2924/14* (2013.01)

(58) Field of Classification Search
CPC .............. C09J 2201/602; C09J 2463/00; C09J 2201/36; C09J 2201/28; C09J 2203/326
See application file for complete search history.

(56) References Cited

U.S. PATENT DOCUMENTS

| | | | | |
|---|---|---|---|---|
| 2009/0053859 A1* | 2/2009 | Xu | ............................ | H01B 1/22 438/118 |
| 2010/0101700 A1* | 4/2010 | Liang | ...................... | B32B 27/16 156/73.1 |
| 2012/0295098 A1* | 11/2012 | Hwang | ....................... | C09J 9/02 428/328 |
| 2014/0141195 A1* | 5/2014 | Liang | ...................... | H05K 3/323 428/98 |
| 2014/0312501 A1* | 10/2014 | Liang | ...................... | B32B 27/16 257/773 |

FOREIGN PATENT DOCUMENTS

| | | |
|---|---|---|
| JP | 2010-033793 A | 2/2010 |
| JP | 2010-199087 A | 9/2010 |
| JP | 4535199 B2 | 9/2010 |
| JP | 2010-232184 A | 10/2010 |
| JP | 2011-002853 A | 1/2011 |
| JP | 2011-076808 A | 4/2011 |
| JP | 4789738 B2 | 10/2011 |
| JP | 2012-086515 A | 5/2012 |
| JP | 2012-169263 A | 9/2012 |
| JP | 2012-172128 A | 9/2012 |
| JP | 2013-058412 A | 3/2013 |
| JP | 2013-105636 A | 5/2013 |
| JP | 2013-149466 A | 8/2013 |
| TW | 201129994 A | 9/2011 |
| TW | 201226518 A | 7/2012 |
| TW | 201322276 A | 6/2013 |
| WO | 2007/040159 A1 | 4/2007 |
| WO | 2008/096872 A1 | 8/2008 |

OTHER PUBLICATIONS

May 12, 2015 Search Report issued in International Patent Application No. PCT/JP2015/053060.
May 12, 2015 Written Opinion issued in International Patent Application No. PCT/JP2015/053060.
Apr. 4, 2018 Office Action in Chinese Application No. 201580007301.
Mar. 27, 2018 Office Action issued in Japanese Application No. 2014-019861.
Jan. 8, 2019 Office Action Issued in Taiwanese Patent Application No. 104103838.
Jan. 15, 2019 Office Action Issued in Chinese Patent Application No. 201580007301.X.
Aug. 2, 2019 Office Action Issued in Taiwanese Patent Application No. 104103838.
Jun. 4, 2020 Office Action issued in Taiwanese Patent Application No. 104103838.
Jun. 29, 2021 Office Action issued in Korean Patent Application No. 10-2016-7021044.

\* cited by examiner

1

ANISOTROPIC CONDUCTIVE FILM AND PRODUCTION METHOD OF THE SAME

TECHNICAL FIELD

The present invention relates to an anisotropic conductive film and a production method of the same.

BACKGROUND ART

An anisotropic conductive film has been widely used in mounting of electronic components such as an IC chip. In recent years, an anisotropic conductive film having a two-layer structure in which conductive particles for anisotropic conductive connection are arranged in a single layer between insulating resin layers having a two-layer structure has been proposed (Patent Literature 1), in order to improve the conduction reliability and the insulating properties, increase the conductive particle capture ratio, and decrease the production cost from the viewpoints of application to high-density mounting.

This anisotropic conductive film having a two-layer structure is produced as follows. Conductive particles are densely disposed in a single layer on an adhesive layer, and the adhesive layer is biaxially stretched to form a sheet in which the conductive particles are arranged. The conductive particles on the sheet are transferred to an insulating resin layer containing a thermosetting resin and a latent curing agent, and another insulating resin layer containing a thermosetting resin and no latent curing agent is laminated on the transferred conductive particles (Patent Literature 1).

CITATION LIST

Patent Literature

Patent Literature 1: Japanese Patent No. 4789738

SUMMARY OF INVENTION

Technical Problem

In Patent Literature 1, when the anisotropic conductive film having a two-layer structure is applied to anisotropic conductive connection, acquisition of favorable conduction reliability and insulating properties against a body to be connected such as an IC chip and a wiring substrate is considered. However, attachment of the film to a substrate without disturbing the arrangement of the conductive particles is not sufficiently investigated. For example, when an adhesion component is changed within the scope of disclosure of Patent Literature 1 in order to improve the adhesion of the anisotropic conductive film, the arrangement of the conductive particles may be disturbed during the operation of mechanically attaching the anisotropic conductive film to the substrate. Therefore, a problem arises in which expected anisotropic conductive connection properties are not obtained.

An object of the present invention is to solve the problem in the conventional techniques described above, and to achieve favorable attachment properties without impairing conduction reliability and insulating properties and disturbing the arrangement of conductive particles in an anisotropic conductive film of a multilayer structure having conductive particles arranged in a single layer.

Solution to Problem

The present inventors have found that an anisotropic conductive film obtained by arranging conductive particles in a single layer on one surface of a photopolymerizable resin layer having fine projections and recesses on another surface, irradiating the photopolymerizable resin layer with ultraviolet light to fix or temporarily fix the conductive particles, and layering a thermo- or photo-cationically, anionically, or radically polymerizable resin layer on the fixed or temporarily fixed conductive particles has a configuration that can achieve the object of the present invention. Thus the present invention has been accomplished. The present inventors have further found that an anisotropic conductive film obtained by disposing conductive particles in a single layer on one surface of a photopolymerizable resin layer, irradiating the photopolymerizable resin layer with ultraviolet light to fix the conductive particles on a photopolymerized resin, further layering a thermo- or photo-polymerizable resin layer on the fixed conductive particles, and layering a thermo- or photo-polymerizable resin layer exhibiting a predetermined tack force on another surface of the photopolymerizable resin layer can achieve the above-described object of the present invention. Thus the present invention has been accomplished.

A first aspect of the present invention provides an anisotropic conductive film having a first connection layer and a second connection layer formed on a surface of the first connection layer, wherein the first connection layer is a photopolymerized resin layer, the second connection layer is a thermo- or photo-cationically, anionically, or radically polymerizable resin layer, and the first connection layer has conductive particles for anisotropic conductive connection that are arranged in a single layer on a surface on a side of the second connection layer, and fine projections and recesses are provided to a surface of the first connection layer opposite to the side of the second connection layer.

A second aspect of the present invention provides an anisotropic conductive film having a second connection layer layered on a surface of a first connection layer and a third connection layer layered on another surface of the first connection layer, wherein the first connection layer is formed of a photopolymerized resin, the second and third connection layers are each formed of a thermo-cationically or thermo-anionically polymerizable resin, a photo-cationically or photo-anionically polymerizable resin, a thermo-radically polymerizable resin, or a photo-radically polymerizable resin, the third connection layer has a tack force larger than 3 kPa that is measured by a probe method (stainless cylindrical probe, diameter: 5 mm, pressing load: 196 kgf, pressing rate: 30 mm/min, separation rate: 5 mm/min), and the first connection layer has conductive particles for anisotropic conductive connection arranged in a single layer on a surface thereof on a side of the second connection layer.

It is preferable that the second connection layer and the third connection layer be a thermopolymerizable resin layer using a thermal polymerization initiator that initiates a polymerization reaction by heating. The second connection layer and the third connection layer may be a photopolymerizable resin layer using a photopolymerization initiator that initiates a polymerization reaction by light. The second connection layer and the third connection layer may be a thermo- and photo-polymerizable resin layer using a thermal polymerization initiator and a photopolymerization initiator in combination. Herein, the second connection layer may be restricted to a thermopolymerizable resin layer using a thermal polymerization initiator in terms of production.

The present invention provides a production method of the anisotropic conductive film of the above-described first aspect of the present invention including the following steps (A) to (D) of forming the first connection layer by a photopolymerization reaction in a single step, or the following steps (AA) to (EE) of forming the first connection layer by a photopolymerization reaction in two steps.

(When First Connection Layer is Formed by Photopolymerization Reaction in Single Step)

Step (A)

A step of forming a photopolymerizable resin layer having fine projections and recesses in a surface thereof using an original plate having fine projections and recesses;

Step (B)

a step of arranging conductive particles in a single layer on another surface of the photopolymerizable resin layer having the fine projections and recesses in the surface;

Step (C)

a step of irradiating the photopolymerizable resin layer having the arranged conductive particles with ultraviolet light to cause a photo-radical polymerization reaction to form the first connection layer in which the fine projections and recesses are formed in the one surface and the conductive particles are fixed in the other surface; and Step (D)

a step of forming the second connection layer that includes a thermo- or photo-cationically, anionically, or radically polymerizable resin layer on the other surface of the first connection layer on a side of the fixed conductive particles.

(When First Connection Layer is Formed by Photopolymerization Reaction in Two Steps)

Step (AA)

A step of forming a photopolymerizable resin layer having fine projections and recesses in a surface thereof using an original plate having fine projections and recesses;

Step (BB)

a step of arranging conductive particles in a single layer on another surface of the photopolymerizable resin layer having the fine projections and recesses on the surface;

Step (CC)

a step of irradiating the photopolymerizable resin layer having the arranged conductive particles with ultraviolet light to cause a photopolymerization reaction to form a first temporary connection layer in which the fine projections and recesses are formed in the one surface and the conductive particles are temporarily fixed in the other surface;

Step (DD)

a step of forming the second connection layer that includes a thermo-cationically, anionically, or radically polymerizable resin layer on a surface of the first temporary connection layer on a side of the conductive particles; and Step (EE)

a step of irradiating the first temporary connection layer with ultraviolet light from a side opposite to the second connection layer to cause a photopolymerization reaction, thereby fully curing the first temporary connection layer to form the first connection layer.

In order not to adversely affect the product life of the anisotropic conductive film, connection, and the stability of a connection structure, an initiator used in the formation of the second connection layer at the step (DD) is restricted to a thermal polymerization initiator. Specifically, when the first connection layer is irradiated with ultraviolet light in two steps, the initiator for the second connection layer may be restricted to the thermal polymerization initiator in terms of restriction of the step. When the irradiation with ultraviolet light in two steps is continuously performed, the first connection layer can be formed at the substantially same step as the step in the single step. Therefore, the same function effect can be expected.

The present invention further provides a production method of the anisotropic conductive film of the above-described second aspect of the present invention including the following steps (A') to (D'):

Step (A')

a step of disposing conductive particles in a single layer on a surface of a photopolymerizable resin layer; Step (B')

a step of irradiating the photopolymerizable resin layer having the disposed conductive particles with ultraviolet light to cause a photopolymerization reaction, thereby forming the first connection layer in which the conductive particles are fixed in the surface thereof;

Step (C')

a step of layering the second connection layer that is formed of a thermo-cationically or thermo-anionically polymerizable resin, a photo-cationically or photo-anionically polymerizable resin, a thermo-radically polymerizable resin, or a photo-radically polymerizable resin on a surface of the first connection layer on a side of the conductive particles; and Step (D')

a step of layering the third connection layer that is formed of a thermo-cationically or thermo-anionically polymerizable resin, a photo-cationically or photo-anionically polymerizable resin, a thermo-radically polymerizable resin, or a photo-radically polymerizable resin, and has a tack force larger than 3 kPa that is measured by a probe method (stainless cylindrical probe, diameter: 5 mm, pressing load: 196 kgf, pressing rate: 30 mm/min, separation rate: 5 mm/min), wherein the step (D') is performed by layering the third connection layer on the photopolymerizable resin layer before the step (A') or by layering the third connection layer on a surface of the first connection layer opposite to the second connection layer after the step (CI).

The present invention also encompasses an aspect in which the second connection layer functions as a tacky layer.

The present invention further provides a connection structure in which a first electronic component and a second electronic component are connected by anisotropic conductive connection through the above-described anisotropic conductive film.

Advantageous Effects of Invention

The anisotropic conductive film of the first aspect of the present invention has the first connection layer that includes a photopolymerized resin layer, and the second connection layer that includes a thermo- or photo-cationically, anionically, or radically polymerizable resin layer formed on one surface of the first connection layer. In addition, the conductive particles for anisotropic conductive connection are arranged in a single layer on the surface of the first connection layer on the side of the second connection layer. Thus, the conductive particles can be firmly fixed in the first connection layer. As a result, favorable conduction reliability and favorable conductive particle capture ratio can be achieved. Further, fine projections and recesses are formed 1n the surface of the first connection layer opposite to the second connection layer. For this reason, favorable attachment properties can be achieved even when a conventional material is used without changing the first connection layer into a soft material for improvement of attachment properties. Further, repairability can also be improved. In other words, both fixation of the conductive particles in the anisotropic conductive film and the attachment properties of the film can be achieved at the same time.

When the bonding is obtained by heat, the same method as a connection method using a general anisotropic conductive film is used. When the connection is obtained by light, pushing by a connection tool may be performed before a reaction is completed. Also in this case, the connection tool or the like is often heated to promote resin flow and particle pushing. When heat and light are used in combination, the connection may be performed in the same manner as described above.

The anisotropic conductive film of the second aspect of the present invention has the first connection layer obtained by photopolymerizing a photopolymerizable resin layer, and the second connection layer that is layered on a surface of the first connection layer and is polymerized by heat or light. In addition, the conductive particles for anisotropic conductive connection are disposed in a single layer on the surface of the first connection layer on a side of the second connection layer. Thus, the conductive particles can be firmly fixed by the first connection layer that is photopolymerized. When the photopolymerizable resin is irradiated with ultraviolet light from the side of the conductive particles to photopolymerize the photopolymerizable resin in the formation of the first connection layer, the photopolymerizable resin under (on the back side of) the conductive particles is not sufficiently irradiated with ultraviolet light due to shadow of the conductive particles. Therefore, the photopolymerized resin that is shadowed by the conductive particles has a curing ratio lower than that of the photopolymerized resin that is not shadowed. Thus the conductive particles are favorably pushed during anisotropic conductive connection. Accordingly, in the anisotropic conductive film of the present invention, favorable conductive particle capture ratio, conduction reliability, and insulating properties (low short circuit occurrence ratio) can be achieved.

In the anisotropic conductive film of the second aspect of the present invention, the third connection layer is layered on the surface of the first connection layer opposite to the second connection layer, and has tackiness. Therefore, when the anisotropic conductive film of the present invention is used for anisotropic conductive connection of electronic components, the anisotropic conductive film can be temporarily attached to the electronic components without deformation, and shift of positions of the conductive particles due to the temporary attachment can be prevented. For this reason, an effect of increasing the conductive particle capture ratio obtained by disposing the conductive particles in a predetermined arrangement in the anisotropic conductive film is easy to be obtained.

Further, the adhesion strength of a connection structure connected by anisotropic conductive connection is also increased by layering the third connection layer.

When the second or third connection layer in the anisotropic conductive film of the second aspect of the present invention is formed of a polymerizable resin to be reacted by heat, anisotropic conductive connection of electronic components using the anisotropic conductive film can be performed in the same manner as the connection method using a general anisotropic conductive film. On the other hand, when the second or third connection layer in the anisotropic conductive film of the second aspect of the present invention is formed of a polymerizable resin to be reacted by light, anisotropic conductive connection of first and second electronic components using the anisotropic conductive film needs to be performed by pushing by a connection tool before a photoreaction is completed. In this case, the connection tool or the like may be heated to promote resin flow and particle pushing. Even when the polymerizable resin to be reacted by heat and the polymerizable resin to be reacted by light are used in the second or third connection layer, pushing by the connection tool may be performed before a photoreaction is completed in the same manner as described above and heating may be performed.

DESCRIPTION OF EMBODIMENTS

Anisotropic Conductive Film

Hereinafter, a preferable example of the anisotropic conductive film of the first aspect of the present invention will be described in detail.

Figure 1:
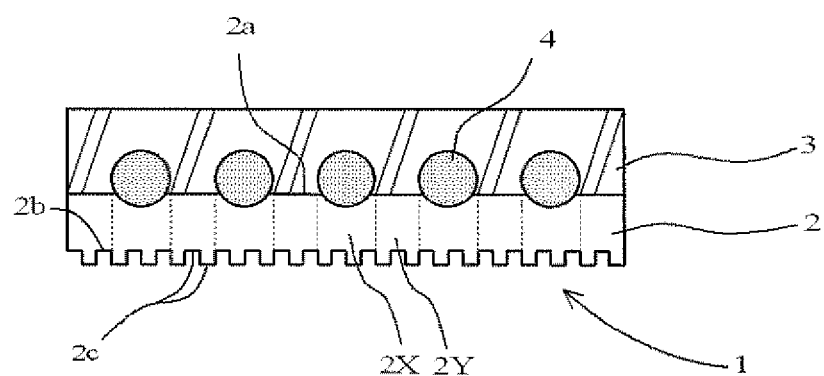
FIG. 1 is a cross-sectional view of an anisotropic conductive film of the first aspect of the present invention.

As shown in FIG. 1, the anisotropic conductive film 1 of the first aspect of the present invention has a configuration in which a second connection layer 3 that includes a thermo- or photo-cationically, anionically, or radically polymerizable resin layer is formed on one surface of a first connection layer 2 that includes a photopolymerized resin layer obtained by photopolymerizing a photopolymerizable resin layer having fine projections and recesses 2c on the other surface 2b. On a surface 2a of the first connection layer 2 on a side of the second connection layer 3, conductive particles 4 are arranged in a single layer, and preferably uniformly arranged, for anisotropic conductive connection. The expression uniformly herein means a state where the conductive particles are arranged in a plane direction. This regularity may be defined as constant intervals.

<First Connection Layer 2>

The first connection layer 2 constituting the anisotropic conductive film 1 of the first aspect of the present invention is a photopolymerized resin layer (preferably an insulating photopolymerized resin layer) obtained by photopolymerizing a photopolymerizable resin layer having fine projections and recesses on a surface. Therefore, the conductive particles can be fixed. Because of polymerization, the resin is unlikely to flow even under heating during anisotropic conductive connection. Therefore, the occurrence of short circuit can be largely suppressed. Accordingly, the conduction reliability can be improved, and the mounting conductive particle capture ratio can also be improved. Further, since the fine projections and recesses are formed on the one surface of the first connection layer, favorable attachment properties can be achieved without disturbing the arrangement of the conductive particles. The conductive particles are held by the first connection layer that is photopolymerized by irradiation with light. Therefore, the film itself is flexible, and as a result, the repairability can be improved.

Because of the fine projections and recesses, the surface area of the first connection layer 2 is increased. Therefore, when the first connection layer 2 contains an unpolymerized component, improved surface tackiness due to exudation of the unpolymerized component can be expected.

A preferable aspect of the first connection layer 2 is a photo-radically polymerized resin layer obtained by photo-radical polymerization of a photo-radically polymerizable resin layer that has fine projections and recesses on a surface and contains an acrylate compound and a photo-radical polymerization initiator. Hereinafter, a case where the first connection layer 2 is the photo-radically polymerized resin layer will be described.

Examples of a procedure of forming fine projections and recesses on a surface of the photopolymerizable resin layer may include a procedure in which a photopolymerizable resin composition is applied to a roll-shaped or plate-shaped original plate that has fine projections and recesses and is made of metal or glass, and semi-cured by irradiation with ultraviolet light, and a procedure in which a photo-radically polymerizable resin film is pushed on the original plate, and semi-cured by irradiation with ultraviolet light. In addition, fine projections and recesses can be formed on a surface of the photopolymerizable resin layer by a procedure disclosed in Japanese Patent Application Laid-Open No. 2011-2853, WO2007/040159, WO2008/096872, Japanese Patent Application Laid-Open No. 2012-086515, or Japanese Patent No. 4535199. These procedures are used when the fine structure is the finest. In order to make the fine structure larger, various known procedures may be used to obtain an original plate for formation of projections and recesses. An aspect using the original plate is also included in the present invention.

The fine projections and recesses 2c are formed preferably in a regular pattern in a plane direction in terms of simplicity of quality inspection during production. Examples of the regular pattern may include a hexagonal lattice, an orthorhombic lattice, a square lattice, a rectangular lattice, and a parallel lattice.

In terms of achieving both attachment properties and repairability, the average distance (projection-recess depth) from the bottoms of the recesses to the vertexes of the projections in the fine projections and recesses $2c$ is preferably $\frac{1}{50}$ to 10 times, and more preferably $\frac{1}{20}$ to 3 times the average particle diameter of the conductive particles 4. In terms of achieving both attachment properties and repairability, the pitch (width of a projection-recess cycle) of the fine projections and recesses $2c$ is preferably $\frac{1}{50}$ to 10 times, and more preferably $\frac{1}{20}$ to 3 times the average particle diameter of the conductive particles 4.

The average distance from the bottoms of the recesses to the vertexes of the projections in the fine projections and recesses $2c$ and the pitch of the projections and recesses can be measured using an electron microscope and an optical microscope.

In the present invention, it is preferable that the heights of the fine projections and recesses $2c$ be made uniform. When the heights of the fine projections and recesses $2c$ are made uniform, the contact points of the projections of the fine projections and recesses $2c$ increase to increase the friction coefficient of the first connection layer 2. Therefore, position shift during use of the anisotropic conductive film is easily prevented. The anisotropic conductive film is cut, and a cross section thereof is observed by a scanning electron microscope. Thus, a degree at which the heights of the fine projections and recesses are made uniform can be evaluated. Specifically, the degree can be evaluated as follows. A surface of the cut anisotropic conductive film on a side of the second connection layer is used as a reference surface. In a predetermined number of projections (for example, 200 projections in each of ten selected regions), the distances from the reference surface to tips of the projections are measured, and the average thereof (average height) is determined. The average height and each distance between the projections are compared. For example, it is preferable that the distance from the reference surface to the tip of each projection be 90% to 110% of the average height.

(Acrylate Compound)

As an acrylate compound that is an acrylate unit, a conventionally known photo-radically polymerizable acrylate can be used. For example, a monofunctional (meth)acrylate (herein, (meth)acrylate includes acrylate and methacrylate), or a multifunctional (meth)acrylate having two or more functional groups can be used. In the present invention, in order to obtain a thermosetting adhesive, it is preferable that a multifunctional (meth)acrylate be used in at least a portion of acrylic monomers.

When the content of the acrylate compound in the first connection layer 2 is too small, a difference in viscosity between the first connection layer 2 and the second connection layer 3 is unlikely to be generated. When the content thereof is too large, the curing shrinkage increases and the workability tends to decrease. Therefore, the content thereof is preferably 2 to 70% by mass, and more preferably 10 to 50% by mass.

(Photo-Radical Polymerization Initiator)

As the photo-radical polymerization initiator, a publicly known photo-radical polymerization initiator can be appropriately selected and used. Examples of the publicly known photo-radical polymerization initiator may include an acetophenone-based photopolymerization initiator, a benzylketal-based photopolymerization initiator, and a phosphorus-based photopolymerization initiator.

When the amount of the photo-radical polymerization initiator to be used is too small relative to 100 parts by mass of the acrylate compound, photo-radical polymerization does not sufficiently proceed. When the amount is too large, stiffness may decrease. Therefore, the amount is preferably 0.1 to 25 parts by mass, and more preferably 0.5 to 15 parts by mass.

(Conductive Particles)

As the conductive particles, conductive particles used in conventionally known anisotropic conductive films can be appropriately selected and used. Examples of the conductive particles may include metal particles such as nickel, cobalt, silver, copper, gold, and palladium particles, and metal-coated resin particles. Two or more kinds thereof may be used in combination.

When the average particle diameter of the conductive particles is too small, the variation of heights of wirings cannot be absorbed, and the resistance tends to increase. When the average particle diameter is too large, short circuit tends to occur. Therefore, the average particle diameter is preferably 1 μm or more, and more preferably 2 μm or more, and is preferably 30 μm or less, more preferably 15 km or less, 10 μm or less, and 6 μm or less. Specifically, the average particle diameter is preferably 1 to 30 μm, and more preferably 2 to 15 μm.

When the amount of such conductive particles in the first connection layer 2 is too small, the capture number of mounting conductive particles decreases, and the anisotropic conductive connection is difficult. When the amount is too large, short circuit may occur. Therefore, the amount is preferably 50 to 50,000, and more preferably 200 to 30,000 per square millimeter.

In the first connection layer 2, if necessary, a film-forming resin such as a phenoxy resin, an epoxy resin, an unsaturated polyester resin, a saturated polyester resin, a urethane resin, a butadiene resin, a polyimide resin, a polyamide resin, and a polyolefin resin can also be used in combination. In the second connection layer 3, the film-forming resin may also be used in combination similarly.

When the thickness of the first connection layer 2 is too small, the mounting conductive particle capture ratio tends to decrease. When the thickness is too large, the conduction resistance tends to increase. Therefore, the thickness is preferably 1.0 to 6.0 μm, and more preferably 2.0 to 5.0 μm.

The first connection layer 2 may further contain an epoxy compound and a thermo- or photo-cationic or anionic polymerization initiator. In this case, it is preferable that the second connection layer 3 be also a thermo- or photo-cationically or anionically polymerizable resin layer containing an epoxy compound and a thermo- or photo-cationic or anionic polymerization initiator, as described below. Thus, the delamination strength can be improved. The epoxy compound and the thermo- or photo-cationic or anionic polymerization initiator will be described in the second connection layer 3.

In the first connection layer 2, it is preferable that the conductive particles 4 eat into the second connection layer 3 (i.e., the conductive particles 4 be exposed to the surface of the first connection layer 2), as shown in FIG. 1. When all the conductive particles are embedded in the first connection layer 2, the connection resistance may be increased. When a degree of eating-into is too small, the mounting conductive particle capture ratio tends to decrease. When the degree is too large, the conduction resistance tends to increase. Therefore, the degree is preferably 10 to 90%, and more preferably 20 to 80% of the average particle diameter of the conductive particles.

When the photopolymerizable resin layer is irradiated with ultraviolet light to form the first connection layer 2, any of a surface where the fine projections and recesses 2c are formed and a surface where the conductive particles are disposed may be first irradiated. When the surface where the conductive particles are disposed is first irradiated, the curing ratio in a region 2X of the first connection layer between the conductive particles 4 and an outermost surface 2b of the first connection layer 2 in the first connection layer 2 (i.e., a region where the conductive particles are present on the second connection layer side in the first connection layer) can be made lower than that in a region 2Y of the first connection layer between the adjacent conductive particles 4 (i.e., a region where the conductive particles are not present on the second connection layer side in the first connection layer). Thus, the region 2X of the first connection layer is easy to be eliminated during thermocompression-bonding of anisotropic conductive connection. The conduction reliability is thus improved. The curing ratio herein represents a value defined as a decrease ratio of a vinyl group. The curing ratio in the region 2X of the first connection layer is preferably 40 to 80%, and the curing ratio in the region 2Y of the first connection layer is preferably 70 to 100%.

When the surface where the conductive particles are not disposed is irradiated, the curing ratios in the regions 2X and 2Y of the first connection layer are not substantially different. This is preferable in terms of quality of an ACF product. This is because the fixation of the conductive particles can proceed and stable quality can be ensured at an ACF production process. Further, pressures applied to the arranged conductive particles at a winding start and a winding end can be made substantially the same in elongating the product in a general manner, and disordered arrangement can be prevented.

Photo-radical polymerization for formation of the first connection layer 2 may be performed in a single step (that is, by one irradiation with light), or in two steps (that is, by two-times irradiations with light). In this case, it is preferable that the second connection layer 3 be first formed on the other surface of the first connection layer 2 where the conductive particles 4 are disposed and a surface of the first connection layer 2 where the fine projections and recesses are formed be then irradiated with light at the second step under an oxygen-containing atmosphere (in the air).

As a result, a radical polymerization reaction is inhibited by oxygen to increase the surface concentration of an uncured component. Thus, an effect capable of improving the tackiness can be expected. Curing in two steps makes the polymerization reaction complex. Therefore, detailed control of fluidity of the resin and the particles can be expected.

In the region 2X of the first connection layer in such photo-radical polymerization in two steps, the curing ratio at the first step is preferably 10 to 50%, and the curing ratio at the second step is preferably 40 to 80%. In the region 2Y of the first connection layer, the curing ratio at the first step is preferably 30 to 90%, and the curing ratio at the second step is preferably 70 to 100%.

When a photo-radical polymerization reaction for formation of the first connection layer 2 is performed in two steps, only one kind of a radical polymerization initiator may be used. It is preferable, however, that two kinds of photo-radical polymerization initiators having different wavelength ranges that initiate a radical reaction be used in order to improve the tackiness. For example, it is preferable that a photo-radical polymerization initiator that initiates a radical reaction by light having a wavelength of 365 nm from an LED light source (for example, IRGACURE 369 available from BASF Japan Ltd.) and a photo-radical polymerization initiator that initiates a radical reaction by light from a light source of a high pressure mercury lamp (for example, IRGACURE 2959 available from BASF Japan Ltd.) be used in combination. When the two kinds of different photo-radical polymerization initiators are used, bonding of the resin is complicated. As a result, a behavior of thermal flow of the resin during connection can be more finely controlled. This is because a force in a thickness direction tends to be applied to the particles and the flow of the particles in a plane direction is suppressed upon pushing during anisotropic conductive connection. The effects of the present invention tend to be expressed.

The lowest melt viscosity of the first connection layer 2 measured by a rheometer is higher than that of the second connection layer 3. Specifically, a value of [the lowest melt viscosity of the first connection layer 2 (mPa·s)]/[the lowest melt viscosity of the second connection layer 3 (mPa·s)] is preferably 1 to 1,000, and more preferably 4 to 400. Among the lowest melt viscosities, the lowest melt viscosity of the former is preferably 100 to 100,000 mPa·s, and more preferably 500 to 50,000 mPa·s. The lowest melt viscosity of the latter is preferably 0.1 to 10,000 mPa·s, and more preferably 0.5 to 1,000 mPa·s.

The first connection layer 2 can be formed by forming fine projections and recesses on the photo-radically polymerizable resin layer using the original plate having fine projections and recesses, then attaching the conductive particles to the surface opposite to the fine projection-recess surface by a procedure such as a film transfer method, a mold transfer method, an inkjet method, or an electrostatic attachment method, and irradiating the photo-radically polymerizable resin layer with ultraviolet light from a side of the conductive particles, an opposite side thereof, or both the sides. It is particularly preferable that the photo-radically polymerizable resin layer be irradiated with ultraviolet light from only the side of the conductive particles since the curing ratio in the region 2X of the first connection layer can be relatively reduced.

<Second Connection Layer 3>

The second connection layer 3 includes a thermo- or photo-cationically, anionically, or radically polymerizable resin layer, and preferably includes a thermo- or photo-cationically or anionically polymerizable resin layer containing an epoxy compound and a thermo- or photo-cationic or anionic polymerization initiator, or a thermo- or photo-radically polymerizable resin layer containing an acrylate compound and a thermo- or photo-radical polymerization initiator. The polymerizable resin layers have insulating properties. Herein, it is desired that the second connection layer 3 be formed from the thermopolymerizable resin layer in terms of convenience of production and quality stability since a polymerization reaction does not occur in the second connection layer 3 by irradiation with ultraviolet light for formation of the first connection layer 2.

When the second connection layer 3 is the thermo- or photo-cationically or anionically polymerizable resin layer, the second connection layer 3 may further contain an acrylate compound and a thermo- or photo-radical polymerization initiator. Thus, the delamination strength from the first connection layer 2 can be improved.

(Epoxy Compound)

When the second connection layer 3 is the thermo- or photo-cationically or anionically polymerizable resin layer containing an epoxy compound and a thermo- or photo-cationic or anionic polymerization initiator, examples of the epoxy compound may include a compound or a resin having two or more epoxy groups in the molecule. The compound and the resin may be liquid or solid.

(Thermal Cationic Polymerization Initiator)

As the thermal cationic polymerization initiator, a publicly known thermal cationic polymerization initiator for an epoxy compound can be used. For example, the thermal cationic polymerization initiator generates an acid, which can cationically polymerize a cationically polymerizable compound, by heat. A publicly known iodonium salt, sulfonium salt, phosphonium salt, or ferrocenes can be used. An aromatic sulfonium salt that exhibits favorable latency for temperature can be preferably used.

When the amount of the thermal cationic polymerization initiator to be added is too small, curing tends to be difficult. When the amount is too large, the product life tends to be reduced. Therefore, the amount is preferably 2 to 60 parts by mass, and more preferably 5 to 40 parts by mass, relative to 100 parts by mass of the epoxy compound.

(Thermal Anionic Polymerization Initiator)

As the thermal anionic polymerization initiator, a publicly known thermal anionic polymerization initiator for an epoxy compound can be used. For example, the thermal anionic polymerization initiator generates a base, which can anionically polymerize an anionically polymerizable compound, by heat. A publicly known aliphatic amine-based compound, aromatic amine-based compound, secondary or tertiary amine-based compound, imidazole-based compound, polymercaptan-based compound, boron trifluoride-amine complex, dicyandiamide, or organic acid hydrazide can be used. An encapsulated imidazole-based compound that exhibits favorable latency for temperature can be preferably used.

When the amount of the thermal anionic polymerization initiator to be added is too small, curing tends to be difficult. When the amount is too large, the product life tends to be reduced. Therefore, the amount is preferably 2 to GO parts by mass, and more preferably 5 to 40 parts by mass, relative to 100 parts by mass of the epoxy compound.

(Photo-Cationic Polymerization Initiator and Photo-Anionic Polymerization Initiator)

As the photo-cationic polymerization initiator or the photo-anionic polymerization initiator for an epoxy compound, a publicly known polymerization initiator can be appropriately used.

(Acrylate Compound)

When the second connection layer 3 is the thermo- or photo-radically polymerizable resin layer containing an acrylate compound and a thermo- or photo-radical polymerization initiator, the acrylate compound described in relation to the first connection layer 2 can be appropriately selected and used.

(Thermal Radical Polymerization Initiator)

Examples of the thermal radical polymerization initiator may include an organic peroxide and an azo-based compound. An organic peroxide that does not generate nitrogen causing bubbles can be preferably used When the amount of the thermal radical polymerization initiator to be used is too small, curing is difficult. When the amount is too large, the product life is reduced. Therefore, the amount is preferably 2 to 60 parts by mass, and more preferably 5 to 40 parts by mass, relative to 100 parts by mass of the acrylate compound.

(Photo-Radical Polymerization Initiator)

As the photo-radical polymerization initiator for an acrylate compound, a publicly known photo-radical polymerization initiator can be used.

When the amount of the photo-radical polymerization initiator to be used is too small, curing is difficult. When the amount is too large, the product life is reduced. Therefore, the amount is preferably 2 to 60 parts by mass, and more preferably 5 to 40 parts by mass, relative to 100 parts by mass of the acrylate compound.

<<Production Method of Anisotropic Conductive Film of First Aspect of the Present Invention>>

The production method of the anisotropic conductive film of the first aspect of the present invention includes a production method that performs a photopolymerization reaction in a single step and a production method that performs a photopolymerization reaction in two steps.

<Production Method that Performs Photopolymerization Reaction in Single Step>

One example in which the anisotropic conductive film of FIG. 1 (FIG. 5B) is produced by photo-polymerization in a single step will be described. This production example includes the following steps (A) to (D).

(Step (A))

Figure 2:
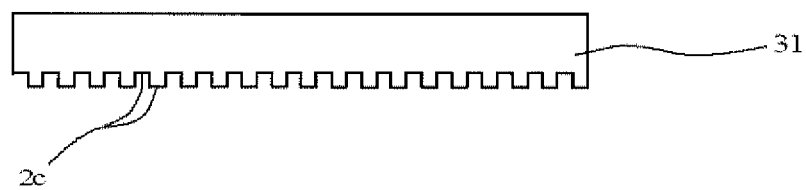
FIG. 2 is an explanatory diagram of a production step (A) of the anisotropic conductive film of the first aspect of the present invention.

As shown in FIG. 2, a photopolymerizable resin layer 31 having the fine projections and recesses 2c on a surface is formed using the original plate having fine projections and recesses (not shown). The formation can be performed using a publicly known procedure. The photopolymerizable resin layer 31 is separated from the original plate, and if necessary, supported on a release film. The photopolymerizable resin layer may be then subjected to a next step. However, it is preferable that the photopolymerizable resin layer 31 supported on the original plate be subjected to the next step since the fine projections and recesses are unlikely to be impaired at a subsequent step.

(Step (B))

Figure 3:
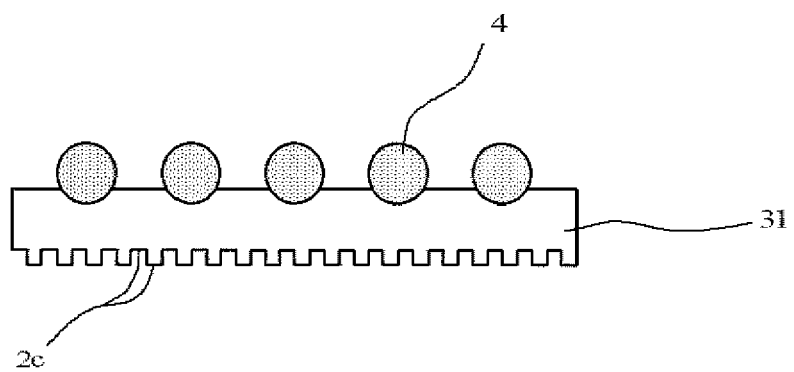
FIG. 3 is an explanatory diagram of a production step (B) of the anisotropic conductive film of the first aspect of the present invention.

As shown in FIG. 3, the conductive particles 4 are arranged in a single layer on the photopolymerizable resin layer 31 having the fine projections and recesses 2c on the surface. A procedure of arranging the conductive particles 4 is not particularly limited. A method for an unstretched polypropylene film in Example 1 of Japanese Patent No. 4789738 using a biaxial stretching operation, a method using a mold in Japanese Patent Application Laid-Open No. 2010-33793, or other methods may be used. For a degree of arrangement, the size, conduction reliability, insulating properties, and mounting conductive particle capture ratio of a connection subject are taken in account, and the conductive particles are preferably arranged so as to be two-dimensionally apart about 1 to about 100 µm from each other.

(Step (C))

Figure 4A:
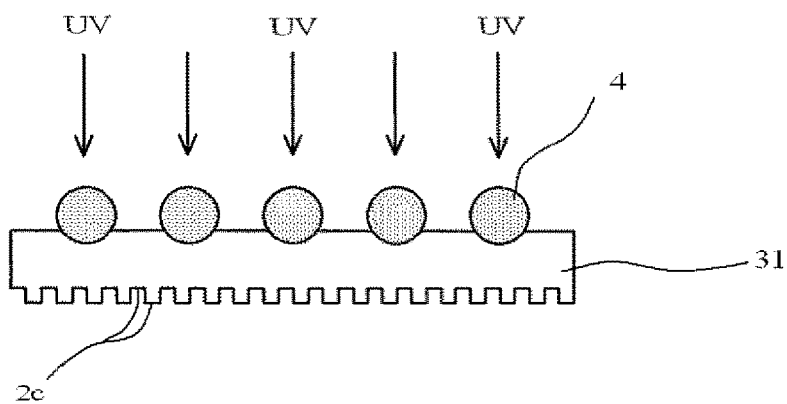
FIG. 4A is an explanatory diagram of a production step (C) of the anisotropic conductive film of the first aspect of the present invention.
Figure 4B:
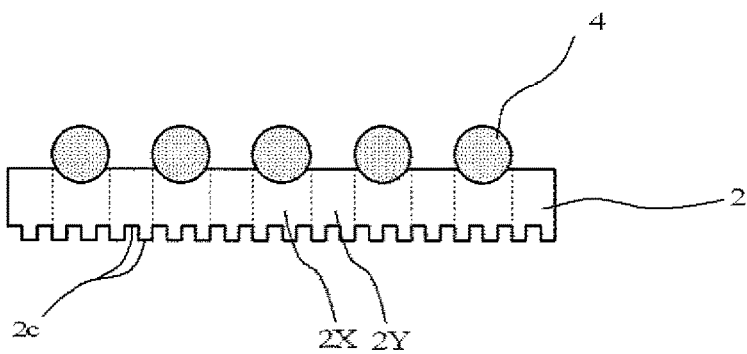
FIG. 4B is an explanatory diagram of the production step (C) of the anisotropic conductive film of the first aspect of the present invention.

As shown in FIG. 4A, the photo-polymerizable resin layer 31 having the arranged conductive particles 4 is irradiated with ultraviolet light to cause a photopolymerization reaction, and the first connection layer 2 in which the conductive particles 4 are fixed in the surface is thus formed. In this case, the photopolymerizable resin layer may be irradiated with ultraviolet light (UV) from the side of the conductive particles or from the side of the fine projections and recesses. When the photopolymerizable resin layer is irradiated with ultraviolet light (UV) from the side of the conductive particles, the curing ratio in the region 2X of the first connection layer between the conductive particles 4 and the outermost surface of the first connection layer 2 can be made lower than that in the region 2Y of the first connection layer between the adjacent conductive particles 4, as shown in FIG. 4B. Thus, the curing properties on the back side of the particles are reliably reduced to facilitate pushing during bonding. In addition, an effect of preventing the flow of the particles can be obtained.

(Step (D))

Figure 5A:
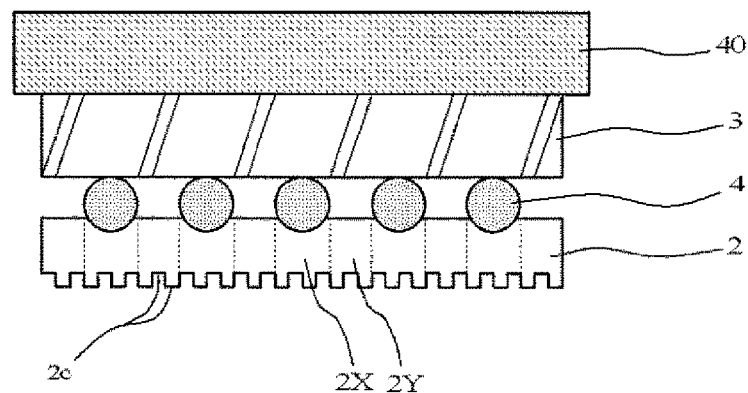
FIG. 5A is an explanatory diagram of a production step (D) of the anisotropic conductive film of the first aspect of the present invention.
Figure 5B:
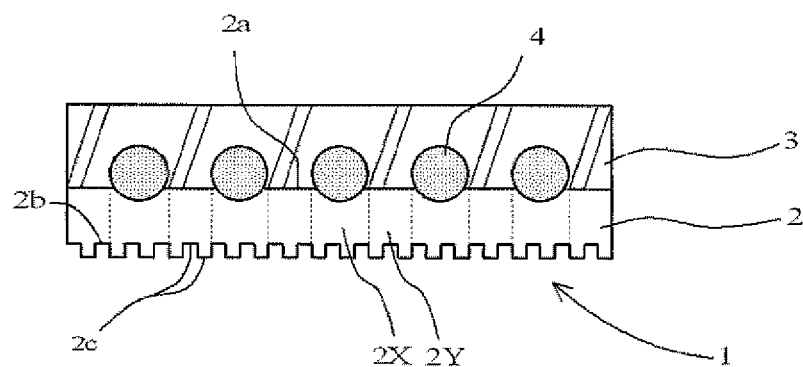
FIG. 5B is an explanatory diagram of the production step (D) of the anisotropic conductive film of the first aspect of the present invention.

As shown in FIG. 5A, the second connection layer 3 that includes a thermo- or photo-cationically, anionically, or radically polymerizable resin layer is formed on a surface of the first connection layer 2 on the side of the conductive particles 4. It is preferable that the second connection layer 3 have insulating properties. Specifically, the second connection layer 3 formed by an ordinary method on a release film 40 is disposed on the surface of the first connection layer 2 on the side of the conductive particles 4 and thermocompression-bonded so as not to cause excessive thermal polymerization. The release film 40 and the original plate are removed. Thus, the anisotropic conductive film 1 of FIG. 5B can be obtained.

(Production Method that Performs Photopolymerization Reaction in Two Steps)

One example in which the anisotropic conductive film of FIG. 1 (FIG. 5B) is produced by photo-polymerization in two steps will be described. This production example includes the following steps (AA) to (EE).

(Step (AA))

Figure 6:
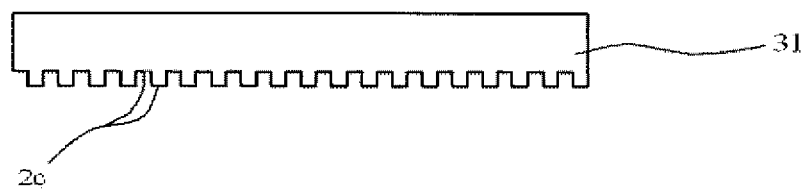
FIG. 6 is an explanatory diagram of a production step (AA) of the anisotropic conductive film of the first aspect of the present invention.

A photopolymerizable resin layer 31 having the fine projections and recesses 2c on a surface is formed using the original plate having fine projections and recesses (not shown), as shown in FIG. 6. The formation can be performed using a publicly known procedure. The photopolymerizable resin layer 31 is separated from the original plate, and if necessary, supported on a release film. The photopolymerizable resin layer may be then subjected to a next step.

However, it is preferable that the photopolymerizable resin layer 31 supported on the original plate be subjected to the next step since the fine projections and recesses are unlikely to be impaired at a subsequent step.

(Step (BB))

Figure 7:
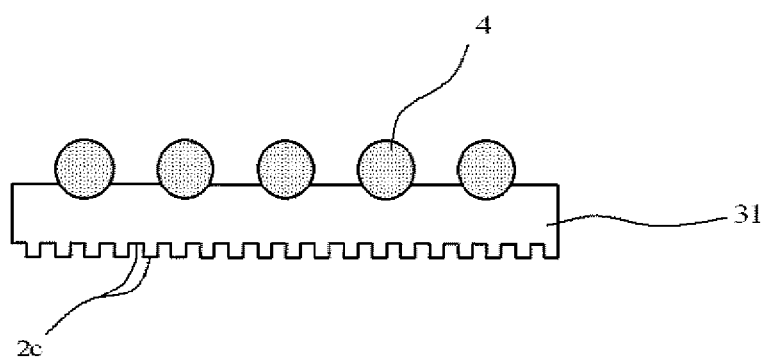
FIG. 7 is an explanatory diagram of a production step (BB) of the anisotropic conductive film of the first aspect of the present invention.

As shown in FIG. 7, the conductive particles 4 are arranged in a single layer on the photopolymerizable resin layer 31 having the fine projections and recesses 2c on the surface.

A procedure of arranging the conductive particles 4 is not particularly limited. The method using a biaxial stretching operation for an unstretched polypropylene film in Example 1 of Japanese Patent No. 4789738, the method using a mold in Japanese Patent Application Laid-Open No. 2010-33793, or other methods may be used. For the degree of arrangement, the size, conduction reliability, insulating properties, and mounting conductive particle capture ratio of a connection subject are taken in account. The conductive particles are preferably arranged so as to be two-dimensionally apart about 1 to about 100 µm from each other.

(Step (CC))

Figure 8A:
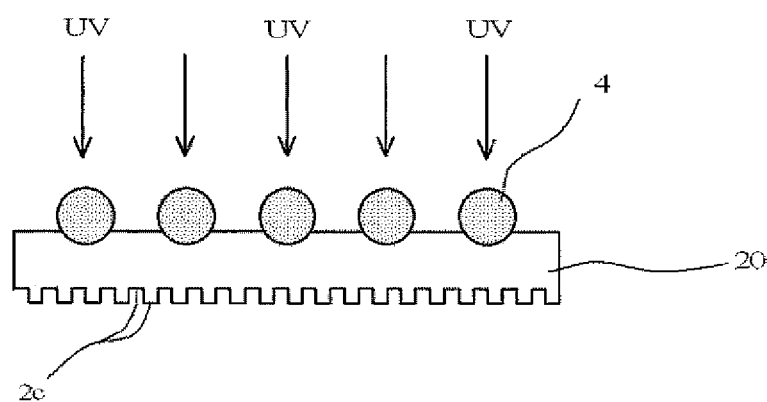
FIG. 8A is an explanatory diagram of a production step (CC) of the anisotropic conductive film of the first aspect of the present invention.
Figure 8B:
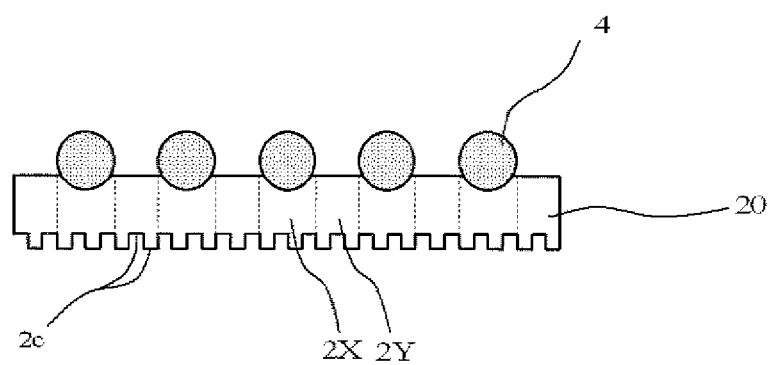
FIG. 8B is an explanatory diagram of the production step (CC) of the anisotropic conductive film of the first aspect of the present invention.

As shown in FIG. 8A, the photopolymerizable resin layer 31 having the arranged conductive particles 4 is irradiated with ultraviolet light to cause a photopolymerization reaction, so that a first temporary connection layer 20 in which the conductive particles 4 are temporarily fixed on the surface is formed. In this case, the photopolymerizable resin layer may be irradiated with ultraviolet light (UV) from the side of the conductive particles or from the side of the fine projections and recesses. When the photopolymerizable resin layer is irradiated with ultraviolet light (UV) from the side of the conductive particles, the curing ratio in the region 2X of the first temporary connection layer between the conductive particles 4 and the outermost surface of the first temporary connection layer 20 can be made lower than that in the region 2Y of the first temporary connection layer between the adjacent conductive particles 4, as shown in FIG. 8B. Thus, the curing properties on the back side of the particles are reliably reduced to facilitate pushing during bonding. In addition, the effect of preventing the flow of the particles can be obtained.

(Step (DD))

Figure 9A:
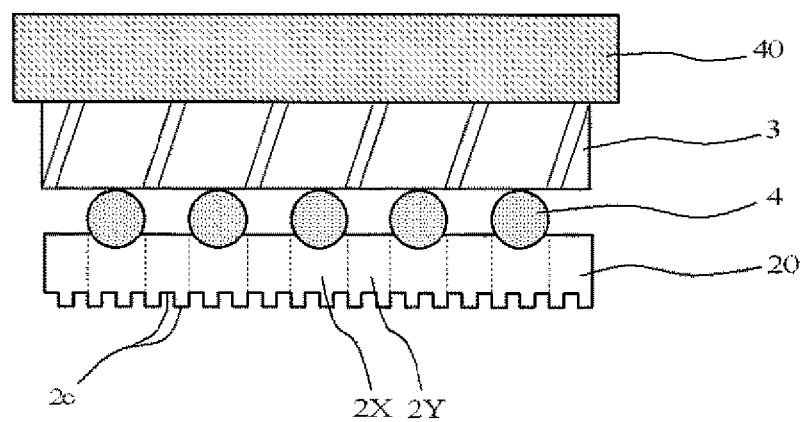
FIG. 9A is an explanatory diagram of a production step (DD) of the anisotropic conductive film of the first aspect of the present invention.
Figure 9B:
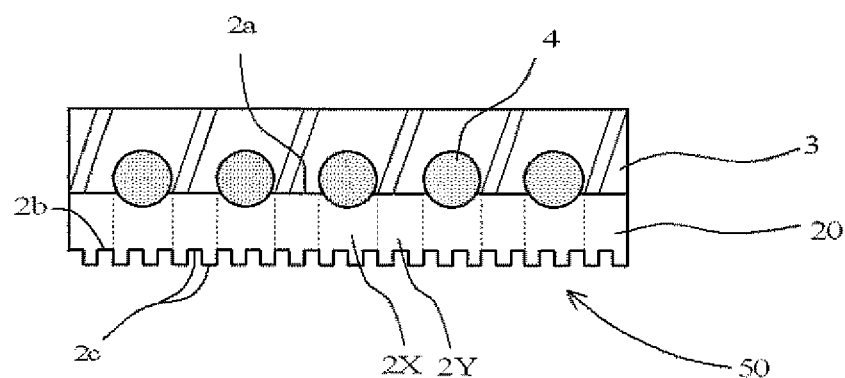
FIG. 9B is an explanatory diagram of the production step (DD) of the anisotropic conductive film of the first aspect of the present invention.

As shown in FIG. 9A, the second connection layer 3 that includes a thermo-cationically, anionically, or radically polymerizable resin layer is formed on a surface of the first temporary connection layer 20 on a side of the conductive particles 4. Specifically, the second connection layer 3 formed by an ordinary method on the release film 40 is disposed on the surface of the first connection layer 2 on the side of the conductive particles 4 and thermocompression-bonding is performed so as not to cause excess thermal polymerization. The release film 40 and the original plate are removed. Thus, a temporary anisotropic conductive film 50 of FIG. 9B can be obtained.

(Step (EE))

Figure 10A:
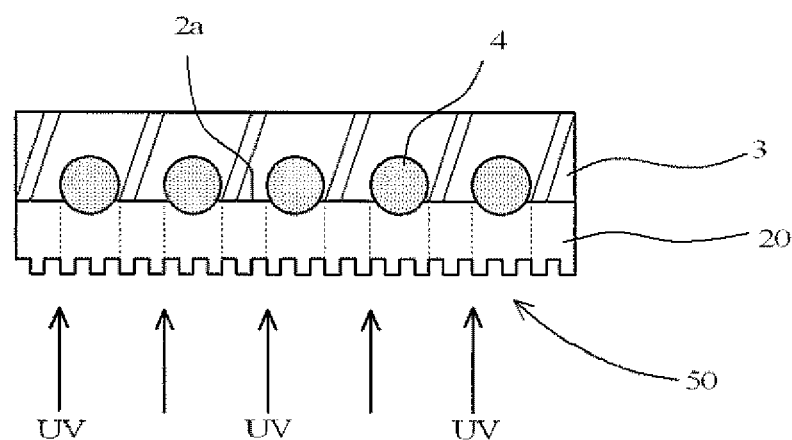
FIG. 10A is an explanatory diagram of a production step (EE) of the anisotropic conductive film of the first aspect of the present invention.
Figure 10B:
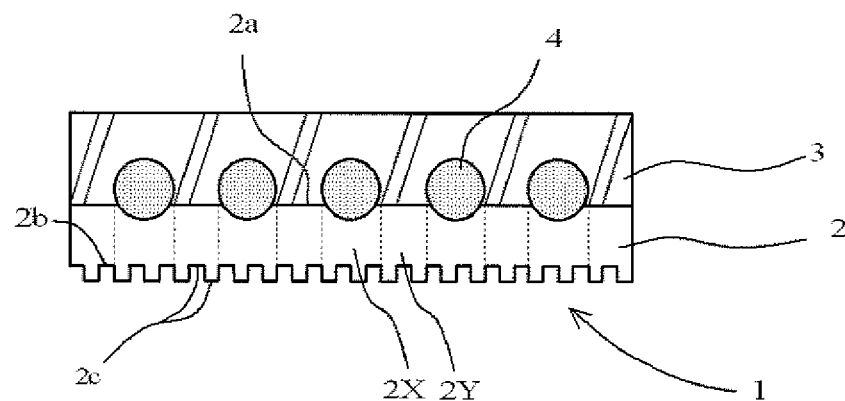
FIG. 10B is an explanatory diagram of the production step (EE) of the anisotropic conductive film of the first aspect of the present invention.

As shown in FIG. 10A, the first temporary connection layer 20 is irradiated with ultraviolet light from the side opposite to the second connection layer 3 to cause a photopolymerization reaction, so that the first temporary connection layer 20 is fully cured to form the first connection layer 2. Thus, an anisotropic conductive film 1 of FIG. 10B can be obtained. At this step, it is preferable that the first temporary connection layer be irradiated with ultraviolet light in a direction perpendicular to the first temporary connection layer. In order not to eliminate a difference in curing ratio between the regions 2X and 2Y of the first connection layer, it is preferable that irradiation be performed through a mask or a difference in amount of irradiated light be produced by an irradiated portion.

<<Anisotropic Conductive Film of Second Aspect of the Present Invention>>

Figure 11:
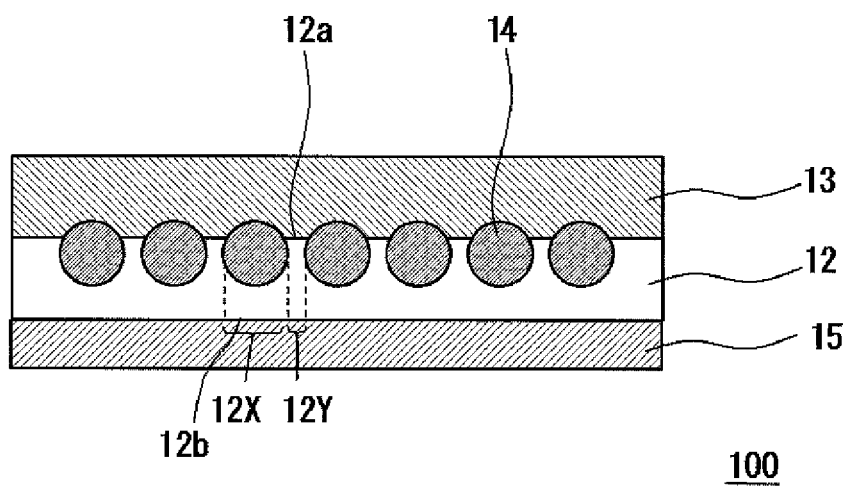
FIG. 11 is a cross-sectional view of an anisotropic conductive film of the second aspect of the present invention.

FIG. 11 is a cross-sectional view of an anisotropic conductive film 100 that is an example of the second aspect of the present invention. In the anisotropic conductive film 100, a second connection layer 13 is layered on a surface of a first connection layer 12, a third connection layer 15 is layered on another surface of the first connection layer 12, and conductive particles 14 for anisotropic conductive connection are arranged in a single layer on the surface 2a of the first connection layer 12 on a side of the second connection layer 13. It is preferable that the first connection layer 12, the second connection layer 13, and the third connection layer 15 have insulating properties.

<First Connection Layer 12>

The first connection layer 12 constituting the anisotropic conductive film 100 of the second aspect of the present invention is formed of a photopolymerized resin. Specifically, the first connection layer 12 is formed by photo-radically polymerizing a photo-radically polymerizable resin layer containing an acrylate compound and a photo-radical polymerization initiator. Since the first connection layer 12 is photopolymerized, the conductive particles 14 can be appropriately fixed. Therefore, even when the anisotropic conductive film 100 is heated during anisotropic conductive connection, the first connection layer 12 is unlikely to flow. Accordingly, the occurrence of short circuit due to excessively flowed conductive particles 14 caused by resin flow can be largely suppressed.

In the anisotropic conductive film 100 of this example, it is particularly preferable that the curing ratio in a region 12X of the first connection layer 12 where the conductive particles 14 are present on the side of the second connection layer 13 (i.e., a region between the conductive particles 14 and a surface 12b of the first connection layer 12 on a side of a third insulating resin) be lower than that in a region 12Y where the conductive particles 14 are not present on the side of the second connection layer 13 side). In the region 12X of the first connection layer 12, the acrylate compound and the photo-radical polymerization initiator in which light curing does not proceed may remain. When the anisotropic conductive film 100 has such a region 12X, the insulating resin in the region 12X is likely to be removed during anisotropic conductive connection. Therefore, the conductive particles 14 are unlikely to move in a plane direction of the first connection layer 12, but are favorably pushed in a thickness direction. Accordingly, the conductive particle capture ratio can be improved, and the conduction reliability and the insulating properties can also be further improved. The curing ratio herein represents a value defined as a decrease ratio of a vinyl group. The curing ratio in the region 12X of the first connection layer is preferably 40 to 80%, and the curing ratio in the region 12Y is preferably 70 to 100%.

(Acrylate Compound)

As an acrylate compound that is an acrylate unit in the second aspect of the present invention, a conventionally known photopolymerizable acrylate can be used. For example, a monofunctional (meth)acrylate (herein, (meth)acrylate includes acrylate and methacrylate), or a multifunctional (meth)acrylate having two or more functional groups can be used. In the present invention, in order to allow the connection layer to be thermoset during anisotropic conductive connection, it is preferable that a multifunctional (meth)acrylate be used in at least a portion of acrylic monomers.

When the content of the acrylate compound in the first connection layer 12 is too small, a difference in viscosity between the first connection layer 12 and the second connection layer 13 during anisotropic conductive connection is unlikely to be generated. When the content thereof is too large, the curing shrinkage increases and the workability tends to decrease. Therefore, the content thereof is preferably 2 to 70% by mass, and more preferably 10 to 50% by mass.

(Polymerization Initiator)

As a photopolymerization initiator used in the formation of the first connection layer 12, for example, a photo-radical polymerization initiator or the like can be used. Specific examples thereof may include an acetophenone-based photopolymerization initiator, a benzylketal-based photopolymerization initiator, and a phosphorus-based photopolymerization initiator. In addition to the photo-radical polymerization initiator, a thermal radical polymerization initiator may be used. Examples of the thermal radical polymerization initiator may include an organic peroxide and an azo-based compound. An organic peroxide that does not generate nitrogen causing bubbles can be preferably used.

When the amount of the photopolymerization initiator to be used is too small relative to 100 parts by mass of the acrylate compound, photopolymerization does not sufficiently proceed. When the amount is too large, stiffness may be reduced. Therefore, the amount is preferably 0.1 to 25 parts by mass, and more preferably 0.5 to 15 parts by mass.

(Other Resin and Polymerization Initiator)

If necessary, the first connection layer 12 may further contain an epoxy compound, a thermal cationic or thermal anionic polymerization initiator, or a photo-cationic or photo-anionic polymerization initiator. Thus, the delamination strength can be improved. The polymerization initiator used with the epoxy compound will be described in the second connection layer 13. In the first connection layer 12, if necessary, a film-forming resin such as a phenoxy resin, an unsaturated polyester resin, a saturated polyester resin, a urethane resin, a butadiene resin, a polyimide resin, a polyamide resin, or a polyolefin resin can also be used in combination.

When the thickness of the first connection layer 12 is too small, the conductive particle capture ratio tends to decrease. When the thickness is too large, the conduction resistance tends to increase. Therefore, the thickness is preferably 1.0 to 6.0 μm, and more preferably 2.0 to 5.0 μm.

The first connection layer 12 can be formed, for example, by attaching the conductive particles in a single layer to the photopolymerizable resin layer containing a photo-radically polymerizable resin and a photo-radical polymerization initiator by a procedure such as a film transfer method, a mold transfer method, an inkjet method, or an electrostatic attachment method, and irradiating the layer with ultraviolet light from a side of the conductive particles, and if necessary, from a side opposite to the conductive particles, to cause photopolymerization. It is preferable that the photopolymerizable resin layer be irradiated with ultraviolet light from only the side of the conductive particles since the curing ratio in the region 12X of the first connection layer can be made relatively lower than that in the region 12Y.

On the other hand, when the photopolymerizable resin forming the first connection layer 12 is irradiated with ultraviolet light from the side opposite to the conductive particles, the curing ratio in the region 12X of the first connection layer is not substantially different from that in the region 12Y. Thus, the fixation of the conductive particles on the first connection layer 12 proceeds. For this reason, stable quality can be ensured at a production line of the anisotropic conductive film. When the anisotropic conductive film is formed in an elongated shape and wound on a reel, pressures applied to the conductive particles at a winding start and a winding end can be made substantially the same, and thus disordered arrangement of the conductive particles can also be prevented.

When photopolymerization is performed by irradiation with ultraviolet light from the side of the conductive particles, photopolymerization may be performed in a single step (that is, irradiated once with light), or in two steps (that is, irradiated two times with light). In this case, it is preferable that the second connection layer 13 first be formed on a surface of the first connection layer 12, and then irradiated with light from another surface thereof at the second step under an oxygen-containing atmosphere (in the air) so that the irradiation intensity is adjusted or a mask is used so as to make the curing ratio in the region 12X lower than that in the region 12Y.

In the region 12X of the first connection layer in such photo-radical polymerization in two steps, the curing ratio at the first step is preferably 10 to 50%, and the curing ratio at the second step is preferably 40 to 80%. In the region 12Y, the curing ratio at the first step is preferably 30 to 90%, and the curing ratio at the second step is preferably 70 to 100%.

When a photo-radical polymerization in two steps is performed, only one kind of a radical polymerization initiator may be used. It is preferable, however, that two kinds of photo-radical polymerization initiators having different wavelength ranges that initiate a radical reaction be used in order to improve the tackiness. For example, it is preferable that a photo-radical polymerization initiator that initiates a radical reaction by light having a wavelength of 365 nm from an LED light source (for example, IRGACURE 369 available from BASF Japan Ltd.) and a photo-radical polymerization initiator that initiates a radical reaction by light from a light source of a high pressure mercury lamp (for example, IRGACURE 2959 available from BASF Japan Ltd.) be used in combination. When the two kinds of different photo-radical polymerization initiators are used, bonding of the resin is complicated. As a result, a behavior of thermal flow of the resin during anisotropic conductive connection can be finely controlled.

The lowest melt viscosity of the first connection layer 12 after photopolymerization is preferably higher than that of the second connection layer 13. Specifically, a value of [the lowest melt viscosity of the first connection layer 12 (mPa·s)]/[the lowest melt viscosity of the second connection layer 13 (mPa·s)] measured by a rheometer is preferably 1 to 1,000, and more preferably 4 to 400. Regarding the respective preferable lowest melt viscosities, the lowest melt viscosity of the first connection layer 12 is preferably 100 to 100,000 mPa·s, and more preferably 500 to 50,000 mPa·s. The lowest melt viscosity of the second connection layer 13 is preferably 0.1 to 10,000 mPa·s, and more preferably 0.5 to 1,000 mPa·s.

<Conductive Particles>

As the conductive particles 14, conductive particles used in conventionally known anisotropic conductive films can be appropriately selected and used. Examples of the conductive particles may include metal particles such as nickel, cobalt, silver, copper, gold, and palladium particles, and metal-coated resin particles. Two or more kinds thereof may be used in combination.

When the average particle diameter of the conductive particles 14 is too small, the variation of heights of wirings cannot be absorbed, and the resistance tends to increase. When the average particle diameter is too large, short circuit tends to occur. Therefore, the average particle diameter is preferably 1 µm or more, and more preferably 2 µm or more, and is preferably 30 µm or less, more preferably 15 µm or less, 10 µm or less, and 6 µm or less. Specifically, the average particle diameter is preferably 1 to 10 µm, and more preferably 2 to 6 µm.

When the amount of such conductive particles in the first connection layer 12 is too small, the capture number of particles decreases, and the anisotropic conductive connection is difficult. When the amount is too large, short circuit may occur. Therefore, the amount is preferably 50 to 50,000, and more preferably 200 to 30,000 per square millimeter.

It is preferable that the conductive particles 14 in the thickness direction of the first connection layer 12 be not embedded in the first connection layer 12 and eat into the second connection layer 13, as shown in FIG. 1. When the conductive particles 14 are embedded in the first connection layer 12, the conductive particles 14 are ununiformly pushed during anisotropic conductive connection. Thus, the conduction resistance of a connection structure anisotropically conductively connected to an electronic component may be increased. When a degree that the conductive particles 14 eat into the second connection layer 13 is too large, the conductive particle capture ratio in a bump may decrease due to resin flow during anisotropic conductive connection. When the degree is too small, the conduction resistance may increase. Therefore, the degree is preferably 10 to 90%, and more preferably 20 to 80% of the average particle diameter of the conductive particles 14.

<Second Connection Layer 13>

The second connection layer 13 is formed by a thermo-cationically or thermo-anionically polymerizable resin, a photo-cationically or photo-anionically polymerizable resin, a thermo-radically polymerizable resin, or a photo-radically polymerizable resin. More specifically, it includes a thermo- or photo-polymerizable resin layer containing an epoxy compound and a thermo-cationic or thermo-anionic polymerization initiator or a photo-cationic or photo-anionic polymerization initiator or a thermo- or photo-radically polymerizable resin layer containing an acrylate compound and a thermo-radical or photo-radical polymerization initiator.

(Epoxy Compound)

As the epoxy compound forming the second connection layer 13; examples of the epoxy compound may include a compound or a resin having two or more epoxy groups in the molecule. The compound and the resin may be liquid or solid.

(Thermal Cationic Polymerization Initiator)

As the thermal cationic polymerization initiator forming the second connection layer 13, a publicly known thermal cationic polymerization initiator for an epoxy compound can be used. For example, a iodonium salt, sulfonium salt, phosphonium salt, or ferrocenes that generates an acid by heat can be used. An aromatic sulfonium salt that exhibits favorable latency for temperature can be preferably used.

When the amount of the thermal cationic polymerization initiator to be added is too small, curing tends to be difficult. When the amount is too large, the product life tends to be reduced. Therefore, the amount is preferably 2 to 60 parts by mass, and more preferably 5 to 40 parts by mass, relative to 100 parts by mass of the epoxy compound.

(Thermal Anionic Polymerization Initiator)

As the thermal anionic polymerization initiator forming the second connection layer 13, a publicly known thermal anionic polymerization initiator for an epoxy compound can be used. For example, an aliphatic amine-based compound, aromatic amine-based compound, secondary or tertiary amine-based compound, imidazole-based compound, poly-mercaptan-based compound, boron trifluoride-amine complex, dicyandiamide, or organic acid hydrazide that generates a base by heat can be used. An encapsulated imidazole-based compound that exhibits favorable latency for temperature can be preferably used.

When the amount of the thermal anionic polymerization initiator to be added is too small, curing tends to be difficult. When the amount is too large, the product life tends to be reduced. Therefore, the amount is preferably 2 to 60 parts by mass, and more preferably 5 to 40 parts by mass, relative to 100 parts by mass of the epoxy compound.

(Photo-Cationic Polymerization Initiator and Photo-Anionic Polymerization Initiator)

As the photo-cationic polymerization initiator or the photo-anionic polymerization initiator for an epoxy compound, a publicly known polymerization initiator can be appropriately used.

(Acrylate Compound)

As the acrylate compound forming the second connection layer 13, the acrylate compound described in relation to the first connection layer 12 can be appropriately selected and used.

(Thermal Radical Polymerization Initiator)

When the second connection layer 13 contains an acrylate compound, a thermal radical polymerization initiator used with the acrylate compound can be appropriately selected from thermal radical polymerization initiators described in relation to the first connection layer 12, and used.

When the amount of the thermal radical polymerization initiator to be used is too small, curing is difficult. When the amount is too large, the product life is reduced. Therefore, the amount is preferably 2 to 60 parts by mass, and more preferably 5 to 40 parts by mass, relative to 100 parts by mass of the acrylate compound.

(Photo-Radical Polymerization Initiator)

As the photo-radical polymerization initiator for an acrylate compound, a publicly known photo-radical polymerization initiator can be used.

When the amount of the photo-radical polymerization initiator to be used is too small, curing is difficult. When the amount is too large, the product life is reduced. Therefore, the amount is preferably 2 to 60 parts by mass, and more preferably 5 to 40 parts by mass, relative to 100 parts by mass of the acrylate compound.

(Thickness of Second Connection Layer 13)

The thickness of the second connection layer 13 is preferably 3 to 20 µm, and more preferably 5 to 15 µm in terms of conductive particle capture properties after connection.

<Third Connection Layer 15>

The third connection layer 15, like as the second connection layer 13, is formed by a thermo-cationically or thermo-anionically polymerizable resin, a photo-cationically or photo-anionically polymerizable resin, a thermo-radically polymerizable resin, or a photo-radically polymerizable resin. More specifically, it includes a thermo- or photo-polymerizable resin layer containing an epoxy compound and a thermo-cationic or thermo-anionic polymerization initiator or a photo-cationic or photo-anionic polymerization initiator or a thermo- or photo-radically polymerizable resin layer containing an acrylate compound and a thermo-radical or photo-radical polymerization initiator.

In the present invention, tackiness is imparted to the third connection layer 15. Specifically, the tack force of the third connection layer 15 that is measured by a probe method (stainless cylindrical probe, diameter: 5 mm, pressing load: 196 kgf, pressing rate: 30 mm/min, separation rate: 5 mm/min) is larger than 3 kPa, preferably larger than 5 kPa, and more preferably larger than 10 kPa. Herein, the tackiness is a value determined from a peak strength in a pressurization profile measured by the probe method. For this reason, it is preferable that the third connection layer 15 be formed of a resin selected from a rosin derivative-based resin, a terpene phenolic resin, an acrylic acrylate oligomer (polymer), a urethane acrylate oligomer, a plastic epoxy, and a reactive dilution-type epoxy (monofunctional epoxy) resin. It is preferable that a forming method be coating or atomization followed by drying.

As described above, tackiness is imparted to the third connection layer 15. Therefore, the anisotropic conductive film 100 of the second aspect of the present invention can be temporarily attached to an electronic component without deformation during use of the anisotropic conductive film for anisotropic conductive connection of the electronic component, and the initial arrangement of the conductive particles can be maintained in the anisotropic conductive film temporarily attached to the electronic component. Accordingly, the conductive particle capture ratio obtained by disposing the conductive particles in the predetermined arrangement can be improved. Specifically, in order to apply the anisotropic conductive film to a fine pitch configuration of terminals of the anisotropically conductively connected electronic component, the conductive particles in the anisotropic conductive film may be arranged at predetermined intervals in a predetermined direction. In general, when the anisotropic conductive film is used for anisotropic conductive connection, the anisotropic conductive film that is elongated and is wound on a reel is unrolled from the reel, temporarily attached to a first electronic component, cut, laminated to a second electronic component, and subjected to anisotropic conductive connection. The cutting size in this case generally has a width of about 1 to about 2 mm and a length of about 15 to about 30 mm during connection of a transparent substrate made of glass or the like and an IC chip. It is important that the anisotropic conductive film is temporarily attached to the electronic component without deformation. When the anisotropic conductive film is deformed by this temporary attachment, the arrangement of the conductive particles is disordered, and a ratio at which a terminal to be connected captures the conductive particles decreases to increase the conduction resistance. However, when tackiness is imparted to the third connection layer 15, the anisotropic conductive film is easy to be temporarily attached to the electronic component without deformation. Therefore, the conductive particle capture ratio in anisotropic conductive connection can be improved.

When tackiness is imparted to the third connection layer 15, the adhesion strength of a connection structure anisotropically conductively connected can also be improved.

<<Production Method of Anisotropic Conductive Film of Second Aspect of the Present Invention>>

The anisotropic conductive film of the second aspect of the present invention can be produced by performing the following steps (A') to (D').

(Step (A'))

Figure 12:
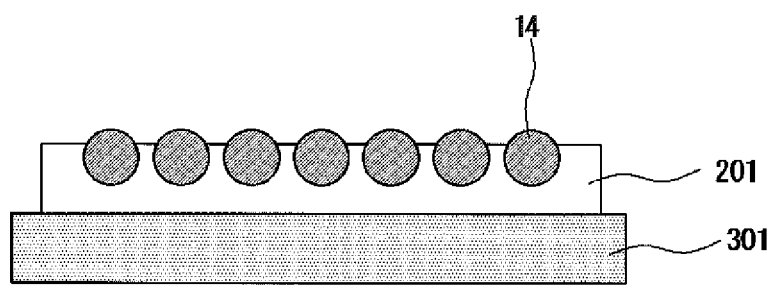
FIG. 12 is an explanatory diagram of a step (A') in the production method of the anisotropic conductive film of the second aspect of the present invention.

As shown in FIG. 12, the conductive particles 14 are arranged in a single layer on a photopolymerizable resin layer 201 that is formed on a release film 301, if necessary. A procedure of arranging the conductive particles 14 in a single layer in the photopolymerizable resin layer 201 is not particularly limited. A method using a biaxial stretching operation for a resin film to which conductive particles are fixed with an adhesive as described in Example 1 of Japanese Patent No. 4789738, a method using a mold in Japanese Patent Application Laid-Open No. 2010-33793, or other methods may be used. It is preferable that the conductive particles 14 be arranged at predetermined intervals vertically and horizontally. In consideration of the size, conduction reliability, insulating properties, and conductive particle capture ratio of a connection subject, the conductive particles are preferably arranged so as to be two-dimensionally apart about 1 to about 100 μm from each other.

(Step (B'))

Figure 13A:
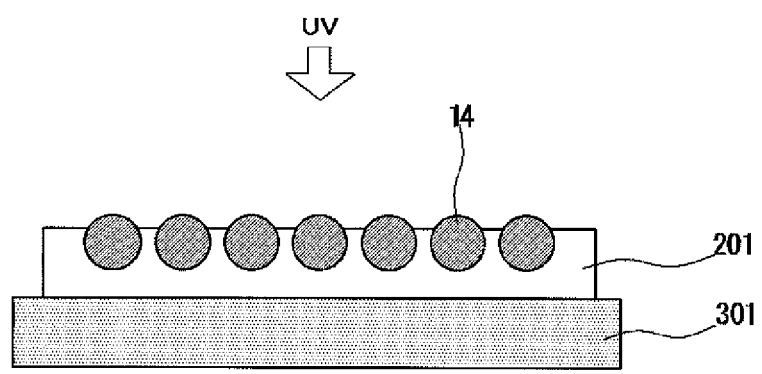
FIG. 13A is an explanatory diagram of a step (B') in the production method of the anisotropic conductive film of the second aspect of the present invention.
Figure 13B:
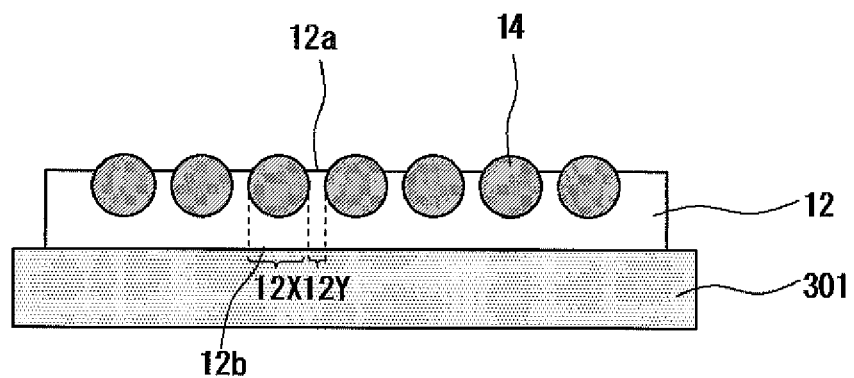
FIG. 13B is an explanatory diagram of the step (B') in the production method of the anisotropic conductive film of the second aspect of the present invention.

As shown in FIG. 13A, the photopolymerizable resin layer 201 having the arranged conductive particles 14 is irradiated with ultraviolet light (UV) from the side of the conductive particles 14 to cause a photopolymerization reaction, and a first connection layer 12 in which the conductive particles 14 are fixed in a surface is thus formed. As shown in FIG. 13B, the curing ratio of a region 12X of the first connection layer where the conductive particles 14 are present on a side of the surface of the first connection layer 12 (a region between a surface 12b of the first connection layer 12 on a side of the release film and the conductive particles 14) can be made lower than that of a region 12Y where the conductive particles 14 are not present on the side of the surface of the first connection layer 12. Therefore, pushing of the conductive particles 14 during anisotropic conductive connection can be facilitated and the flow of the conductive particles 14 in a connection plane direction can be suppressed.

(Step (C'))

Figure 14A:
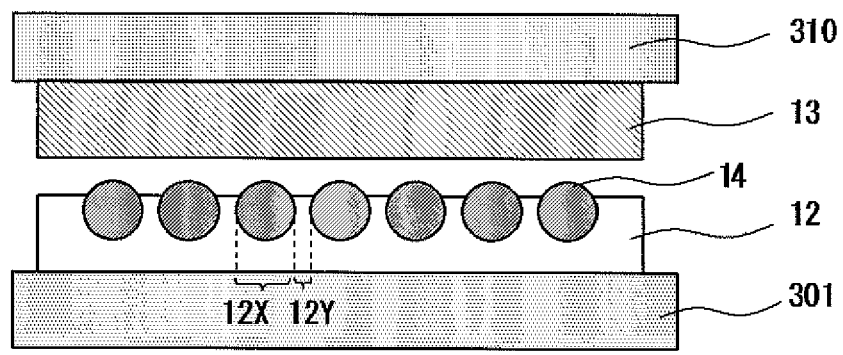
FIG. 14A is an explanatory diagram of a step (C') in the production method of the anisotropic conductive film of the second aspect of the present invention.
Figure 14B:
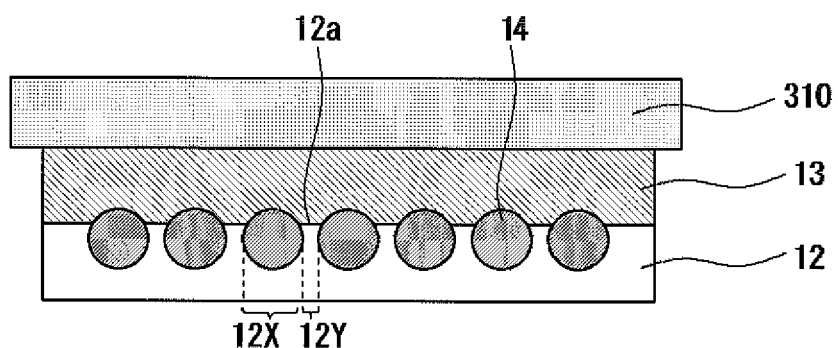
FIG. 14B is an explanatory diagram of the step (C') in the production method of the anisotropic conductive film of the second aspect of the present invention.

As shown in FIG. 14A, a second connection layer 13 that is formed of a thermo-cationically or thermo-anionically polymerizable resin, a photo-cationically or photo-anionically polymerizable resin, a thermo-radically polymerizable resin, or a photo-radically polymerizable resin is layered on a surface of the first connection layer 12 on the side of the conductive particles 14. Specifically, the second connection layer 13 formed on a release film 310 by an ordinary method is disposed on the surface of the first connection layer 12 on the side of the conductive particles 14 and thermocompression-bonded so as not to cause excessive thermal polymerization. The release film 301 is removed. Thus, the anisotropic conductive film of FIG. 14B can be obtained.

(Step (D'))

Figure 15:
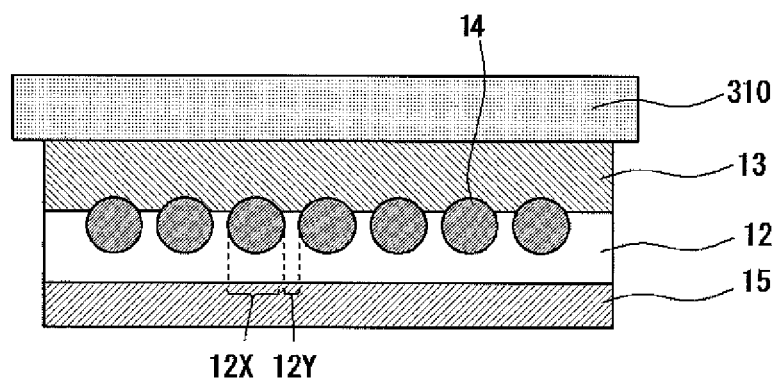
FIG. 15 is an explanatory diagram of a step (D') in the production method of the anisotropic conductive film of the second aspect of the present invention. This is a cross-sectional view of the anisotropic conductive film of the second aspect of the present invention.

As shown in FIG. 15, a third connection layer 15 that is formed of a thermo-cationically or thermo-anionically polymerizable resin, a photo-cationically or photo-anionically polymerizable resin, a thermo-radically polymerizable resin, or a photo-radically polymerizable resin is layered on a surface of the first connection layer 12 opposite to the second connection layer 13. The release film 310 is removed. Thus, the anisotropic conductive film 100 of FIG. 11 can be obtained.

Figure 16:
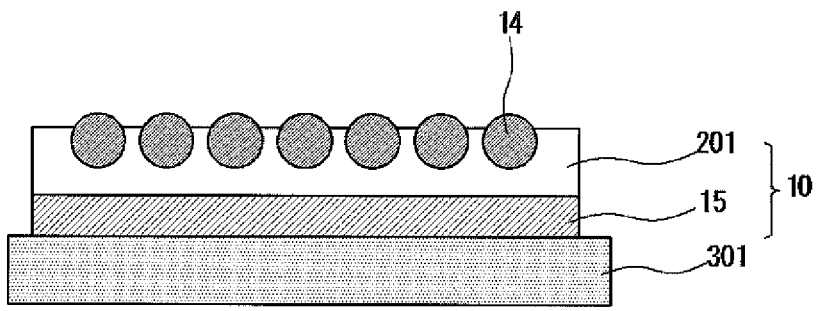
FIG. 16 is an explanatory diagram illustrating a case where the step (D') is performed before the step (A') in the production method of the anisotropic conductive film of the second aspect of the present invention.
Figure 17:
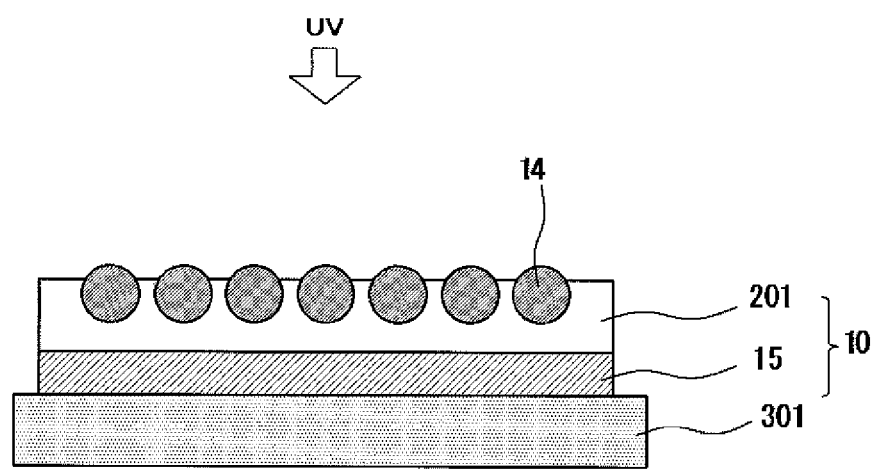
FIG. 17 is an explanatory diagram of the step (B') in the production method of the anisotropic conductive film of the second aspect of the present invention.
Figure 18:
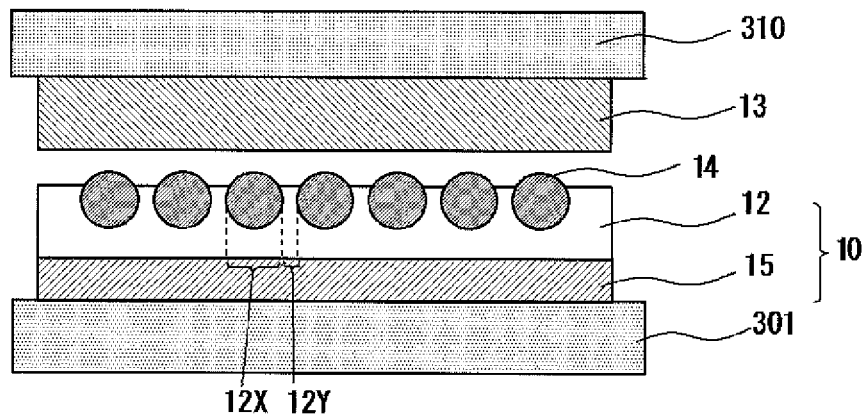
FIG. 18 is an explanatory diagram of the step (C') in the production method of the anisotropic conductive film of the second aspect of the present invention.

Alternatively, the step (D') is performed before the step (C'). As shown in FIG. 16, a layered body 10 including the photopolymerizable resin layer 201 forming the first connection layer and the third connection layer 15 is formed on the release film 301 in advance. The step (A') of disposing the conductive particles 14 on the photopolymerizable resin layer 201 of the layered body 10 is performed. The step (B') (FIG. 17) is then performed in the same manner as described above. At the step (C') (FIG. 18), the second connection layer 13 is layered on a surface of the first connection layer 12 on the side of the conductive particles 14, and the release films 301 and 310 are removed. Thus, the anisotropic conductive film 100 of FIG. 11 may be obtained.

<<Connection Structure>>

The anisotropic conductive films of the first aspect and the second aspect of the present invention thus obtained can be preferably applied to anisotropic conductive connection between a first electronic component such as an IC chip and an IC module and a second electronic component such as a flexible substrate and a glass substrate. The resultant connection structure is also a part of the present invention. It is preferable that a surface of the anisotropic conductive film on the side of the first connection layer be disposed on a side of the second electronic component such as a flexible substrate and a surface of the anisotropic conductive film on the side of the second connection layer be disposed on a side of the first electronic component such as an IC chip since the conduction reliability is enhanced.

EXAMPLES

Hereinafter, the present invention will be described specifically by Examples.

Examples 1 to 6 and Comparative Example 1

Conductive particles were arranged in accordance with an operation of Example 1 of Japanese Patent No. 4789738, and an anisotropic conductive film having a two-layer structure in which first and second connection layers were layered in accordance with a composition (parts by mass) of Table 1 was produced.
(First Connection Layer)

Specifically, an acrylate compound, a photo-radical polymerization initiator, and the like were mixed in ethyl acetate or toluene to prepare a mixed liquid having a solid content of 50% by mass. This mixed liquid was applied to an aluminum plate-shaped original plate in which the occupation area of fine projection-recess structure and the average depth of fine projections and recesses shown in Table 1 were imparted to a first connection layer so that a dried thickness was 3 μm. The mixed liquid was dried in an oven at 80° C. for 5 minutes, to form a photo-radically polymerizable resin layer that was a precursor layer of the first connection layer.

Conductive particles (Ni/Au-plated resin particles, AUL 704, SEKISUI CHEMICAL CO., LTD.) having an average particle diameter of 4 μm were arranged at intervals of 4 μm in a single layer on an exposed surface of the photo-radically polymerizable resin layer that was supported on the original plate. The photo-radically polymerizable resin layer was irradiated with ultraviolet light having a wavelength of 365 nm at an integrated light amount of 4,000 mJ/cm² from the conductive particle side. Thus, the first connection layer in which the conductive particles were fixed in the surface was formed.
(Second Connection Layer)

A thermosetting resin, a latent curing agent, and the like were mixed in ethyl acetate or toluene to prepare a mixed liquid having a solid content of 50% by mass. This mixed liquid was applied to a polyethylene terephthalate film having a thickness of 50 μm so as to have a dried thickness of 12 μm, and dried in an oven at 80° C. for 5 minutes, to form the second connection layer.
(Anisotropic Conductive Film)

The thus obtained first and second connection layers were laminated so that the conductive particles were located inside, to obtain the anisotropic conductive film.

(Connection Structure Sample)

An IC chip having a size of 0.5×1.8×20.0 mm (bump size: 30×85 μm, bump height: 15 μm, bump pitch: 50 μm) was mounted on a glass wiring substrate (1737F) having a size of 0.5×50×30 mm available from Corning Incorporated using the obtained anisotropic conductive film under conditions of 180° C., 80 MPa, and 5 seconds to obtain a connection structure sample.
(Test Evaluation)

As described below, "fine projection-recess structure area occupation ratio," "average depth of fine projections and recesses," "tack force of fine projection-recess surface of the first connection layer," "average distance between the conductive particles within a bump plane (μm)," "conduction reliability," and "insulating properties" of the anisotropic conductive film in the obtained connection structure sample were tested and evaluated. The obtained results are shown in Table 1.

An IC chip having a size of 0.5×1.5×13 mm (gold-plated bump size: 25×140 μm, bump height: 15 μm, space between bumps: 7.5 μm) was mounted on a glass wiring substrate (1737F) having a size of 0.5×50×30 mm available from Corning Incorporated under conditions of 180° C., 80 MPa, and 5 seconds to obtain a connection structure sample. The connection structure sample was used in evaluation of "insulating properties."
"Fine Projection-Recess Structure Area Occupation Ratio"

The fine projection-recess structure area occupation ratio (ratio of area occupied by projections or recesses) of the first connection layer was measured by image analysis of an electronic microscope image.
"Average Depth of Fine Projections and Recesses"

The average depth of the fine projections and recesses (average distance between the bottoms of recesses and the vertexes of projections) of the first connection layer was measured by image analysis of an electronic microscope image.
"Tack Force of Fine Projection-Recess Surface of First Connection Layer"

The tack force of the fine projection-recess surface of the first connection layer was measured by pressing a probe to the first connection layer of the anisotropic conductive film using a tack test machine in accordance with JIS 20237 "adhesion tape/adhesion sheet testing method" (TAC II, RHESCA Corporation) under an atmosphere of 22° C. under measurement conditions of a probe diameter of 5 mm (stainless mirror surface, cylinder), a pressing load of 196 kgf, a pressing rate of 30 mm/min, and a separation rate of 5 mm/min. A tack force larger than 3 kPa can be judged to exhibit excellent attachment properties.
"Average Distance between Conductive Particles within Bump Plane (μm)"

For 100 conductive particles within a bump plane of the connection structure sample, the distances between the conductive particles were measured using an optical microscope. An arithmetic average of the measurement results was determined as an average distance between the conductive particles.
"Conduction Reliability"

The connection structure sample was left under a high-temperature and high-humidity environment of 85° C. and 85% RH for 500 hours. After that the conduction resistance was measured by a digital multimeter (Agilent Technologies). For practical use, the conduction resistance is desirably 4Ω or less.

"Insulating Properties (Short Circuit Occurrence Ratio)"

The short circuit occurrence ratio of a comb-teeth TEG pattern having a space of 7.5 μm was determined. A short circuit occurrence ratio of 100 ppm or less can be judged to exhibit favorable insulating properties in practical terms.

In the anisotropic conductive film of Comparative Example 1, the first connection layer did not have fine projections and recesses on a surface. Therefore, the inter-particle distance between captured conductive particles was comparatively increased, and the insulating properties were

TABLE 1

|  |  |  |  | Example | | | | | | Comparative Example |
|---|---|---|---|---|---|---|---|---|---|---|
|  |  |  |  | 1 | 2 | 3 | 4 | 5 | 6 | 1 |
| First Connection Layer | Phenoxy Resin | YP-50 | Nippon Steel & Sumikin Chemical Co., Ltd. | 60 | 80 | 60 | 60 | 60 | 60 | 60 |
|  | Acrylate | EB600 | Daicel-Alhex Ltd. | 40 | 20 | 40 | 40 | 40 | 40 | 40 |
|  | Photo-Radical Polymerizaton Initiator | IRGACURE 369 | BASF Japan Ltd. | 2 | 2 | 2 | 2 | 2 | 2 | 2 |
|  | Thermal Cationic Polymerization initiator | SI-60L | Sanshin Chemical Industry Co., Ltd. | 2 | 2 | 2 | 2 | 2 | 2 | 2 |
|  | Conductive Particle Arrangement | AUL704 | Sekisui Chemical Co., Ltd. | Uniform | Uniform | Uniform | Uniform | Uniform | Uniform | Uniform |
| Second Connection Layer | Phenoxy Resin | YP-50 | Nippon Steel & Sumikin Chemical Co., Ltd. | 60 | 60 | 60 | 60 | 60 | 60 | 60 |
|  | Epoxy Resin | jER828 | Mitsubishi Chemical Corporation | 40 | 40 | 40 | 40 | 40 | 40 | 40 |
|  | Thermal Cationic Polymerization Initiator | SI-60L | Sanshin Chemical Industry Co., Ltd. | 2 | 2 | 2 | 2 | 2 | 2 | 2 |
| Presence or Absence of Fine Projection-Recess Structure | | | | Presence | Presence | Presence | Presence | Presence | Presence | Absence |
| Fine Projection-Recess Structure Area Occupation Ratio (%) | | | | 90 | 80 | 70 | 60 | 75< | 75< | — |
| Average Depth of Fine Projections and Recesses (μm) | | | | 0.2 | 0.2 | 0.2 | 0.2 | 2 | 8 | — |
| Tack Force of Fine Projection-Recess Surface of First Connection Layer (kPa) | | | | 3< | 3< | 3< | 3< | 5< | 8< | <3 |
| Average Distance between Conductive Particles within Bump Plane (μm) | | | | <4.5 | <4.5 | <4.5 | <4.5 | <4.5 | <4.5 | 4.5 |
| Conduction Reliability (Ω) | | | | 4 | 4 | 4 | 4 | 4 | 4 | 4 |
| Insulating Properties (Short Circuit Occurrence Ratio) (ppm) | | | | 20 | 20 | 20 | 20 | 20 | 20 | 50 |

As seen from Table 1, the "tack force of fine projection-recess surface of the first connection layer" having excellent temporary attachment properties and repairability are shown in the anisotropic conductive films of Examples 1 to 6 since fine projections and recesses were provided on the surface of the first connection layer. As seen from the data of "average distance between the conductive particles within a bump plane (μm)," the conductive particles are unlikely to be shifted during anisotropic conductive connection, and "conduction reliability" and "insulating properties" are excellent.

As described above, the anisotropic conductive films of Examples 1 to 6 had fine projections and recesses on a surface of each first connection layer. For this reason, tackiness was improved. This is considered because the frictional resistance during shifting in a plane direction due to an increase in contact area with an adhesion surface is increased and an uncured resin component contained in the internal of the first connection layer is exuded on the surface. Due to improved tackiness, shifting on the plane is suppressed. Since the anisotropic conductive films had a photo-topolymerized and cured material having projections and recesses (that is, the first connection layer), shifting in the plane direction can be suppressed. In addition, since the anisotropic conductive films contained a cured material, the films are flexible and have good attachment properties.

decreased. This strongly estimates that fine random resin flow occurs in the vicinity of the conductive particles (in particular, in a direction of anisotropic connection, that is, at a site where the conductive particles were pushed) due to the presence of fine projection-recess structure on the surface of the first connection layer corresponding to the back surface of the conductive particles, and shifting of the conductive particles in the plane direction is suppressed. This is supported by a comparatively low short circuit occurrence ratio.

Example 7

An anisotropic conductive film was formed in the same manner as in Example 1 except that a photo-radically polymerizable resin layer was irradiated with ultraviolet light at an integrated light amount of 2,000 mJ/cm$^2$ in the formation of a first connection layer. Further, the anisotropic conductive film was irradiated with ultraviolet light having a wavelength of 365 nm at an integrated light amount of 2,000 mJ/cm$^2$ from the first connection layer side to obtain the anisotropic conductive film of Example 7 in which both surfaces of the first connection layer were irradiated with ultraviolet light. A connection structure sample was formed using the anisotropic conductive film in the same manner as in a case of the anisotropic conductive film of Example 1, and evaluated. Substantially the same results without problems in practical terms were obtained, but the conduction reliability tended to be further improved.

Examples 8 to 19 and Comparative Example 2

Conductive particles were arranged in a single layer in accordance with an operation of Example 1 of Japanese Patent No. 4789738. An anisotropic conductive film of Comparative Example 2 having first and second connection layers formed in accordance with compositions (parts by mass) in Table 2, and anisotropic conductive films of Examples 8 to 19 further having a third insulating resin were produced.

Specifically, an acrylate compound, a photo-radical polymerization initiator, and the like were mixed in ethyl acetate or toluene to prepare a mixed liquid having a solid content of 50% by mass. This mixed liquid was applied to a polyethylene terephthalate film having a thickness of 50 µm so as to have a dried thickness of 3 µm, and dried in an oven at 80° C. for 5 minutes, to form a photo-radically polymerizable resin layer that was a precursor layer of a first connection layer.

Conductive particles (Ni/Au-plated resin particles, AUL 704, SEKISUI CHEMICAL CO., LTD.) having an average particle diameter of 4 µm were arranged on a surface of the obtained photo-radically polymerizable resin layer at the closest intervals therebetween of 4 µm in a single layer in a latticed pattern. The photo-radically polymerizable resin layer was then irradiated with ultraviolet light having a wavelength of 365 nm at an integrated light amount of 4,000 mJ/cm$^2$ from the conductive particle side. Thus, the first connection layer in which the conductive particles were fixed in the surface was formed.

A thermosetting resin, a polymerization initiator, and the like were mixed in ethyl acetate or toluene to prepare a mixed liquid having a solid content of 50% by mass. This mixed liquid was applied to a polyethylene terephthalate film having a thickness of 50 µm so as to have a dried thickness of 12 µm, and dried in an oven at 80° C. for 5 minutes, to form a second connection layer. A third connection layer was similarly formed.

The thus obtained first and second connection layers were laminated so that the conductive particles were located inside, to obtain the anisotropic conductive film of Comparative Example 1. The third connection layer was laminated on a surface of the first connection layer of a layered body including the first and second connection layers to obtain an anisotropic conductive film of each of Examples 8 to 19.

Example 20

An anisotropic conductive film was obtained in the same manner as in Example 1 except that a photo-radically polymerizable resin layer was irradiated with ultraviolet light at an integrated light amount of 2,000 mJ/cm$^2$ from a side of the conductive particles and a side opposite to the conductive particles.
Evaluation An IC chip having a size of 0.5×1.8×20.0 mm (bump size: 30×85 µm, bump height: 15 µm, bump pitch: 50 µm) was mounted on a glass wiring substrate (1737F) having a size of 0.5×50×30 mm available from Corning Incorporated using the obtained anisotropic conductive film of each of Examples and Comparative Examples under conditions of 180° C., 80 MPa, and 5 seconds to obtain a connection structure sample.

As described below, "tack force," "adhesion strength," "initial conduction," "conduction reliability," and "short circuit occurrence ratio" in the obtained connection structure samples were tested and evaluated. The results are shown in Table 2.

"Tack Force"

The tack force was measured by pressing a probe to the third connection layer of the anisotropic conductive film using a tack test machine (TAC II, RHESCA Corporation) in accordance with JIS 20237 "adhesion tape/adhesion sheet testing method" under an atmosphere of 22° C. under measurement conditions of a probe diameter of 5 mm (stainless mirror surface, cylinder), a pressing load of 196 kgf, a pressing rate of 30 mm/min, and a separation rate of 5 mm/min. The peak strength of the measurement chart was taken as the tack force (kPa).

"Adhesion Strength (Die Shear)"

The die shear strength of each produced bonded body was measured using a die shear machine (trade name: Dage2400, manufactured by Dage) at room temperature.

In practical terms, the adhesion strength is preferably 600 N or more.

"Initial Conduction"

The conduction resistance of the connection structure sample was measured.

"Conduction Reliability"

The connection structure sample was left under a high-temperature and high-humidity environment of 85° C. and 85% RH for 500 hours. After that the conduction resistance was measured in the same manner as that for initial conduction. From the viewpoint of practical conduction stability for the connected electronic parts, the conduction resistance of 5Ω or higher is not preferable.

"Short Circuit Occurrence Ratio"

As an IC for evaluation of short circuit occurrence ratio, an IC of a comb-teeth TEG pattern having a space of 7.5 µm (outer diameter: 1.5×13 mm, thickness: 0.5 mm, bump specification: gold-plated, height: 15 µm, size: 25×140 µm, bump gap: 7.5 µm) was prepared. The anisotropic conductive film of each of Examples and Comparative Examples was disposed between the IC for evaluation of short circuit occurrence ratio and a glass substrate of a pattern corresponding to the pattern of the IC, and heated and pressurized under the same condition as in a case of initial conduction, to obtain a connection body. The short circuit occurrence ratio of the connection body was calculated by "short circuit occurrence ratio/total number of spaces of 7.5 µm." The short circuit occurrence ratio is preferably 100 ppm or less in practical terms.

TABLE 2

|  |  |  |  | Example |  |  |  |  |
|---|---|---|---|---|---|---|---|---|
|  |  |  |  | 8 | 9 | 10 | 11 | 12 |
| First Insulating Resin Layer | Phenoxy Resin | YP-50 | Nippon Steel & Sumikin Chemical Co., Ltd. | 80 | 80 | 80 | 80 | 80 |
|  | Acrylate | EB600 | Daicel-Alhex Ltd. | 20 | 20 | 20 | 20 | 20 |
|  | Photo-Radical Polymerization Initiator | IRGACURE 369 | BASF Japan Ltd. | 2 | 2 | 2 | 2 | 2 |
|  | Thermal Cationic Polymerization Initiator | SI-60L | Sanshin Chemical Industry Co., Ltd. | 2 | 2 | 2 | 2 | 2 |
|  | Conductive Particle | AUL704 | Sekisui Chemical Co., Ltd. | Single-Layer Arrangement | | | | |
| Second Insulating Resin Layer | Phenoxy Resin | YP-50 | Nippon Steel & Sumikin Chemical Co., Ltd. | 60 | 60 | 60 | 60 | 60 |
|  | Epoxy Resin | jER828 | Mitsubishi Chemical Corporation | 40 | 40 | 40 | 40 | 40 |
|  | Thermal Cationic Polymerization Initiator | SI-60L | Sanshin Chemical Industry Co., Ltd. | 2 | 2 | 2 | 2 | 2 |
| Third Insulating Resin Layer | Phenoxy Resin | YP-50 | Nippon Steel & Sumikin Chemical Co., Ltd. | 60 | 70 | 60 | 70 | 60 |
|  | Epoxy Resin | YL980 | Mitsubishi Chemical Corporatian | 40 | 30 | — | — | 40 |
|  | Thermal Cationic Polymerization Initiator | SI-60L | Sanshin Chemical Industry Co., Ltd. | 2 | 2 | — | — | 2 |
|  | Acrylate | M-215 | Toagosei Co., Ltd. | — | — | 40 | 30 | — |
|  | Organic Peroxide | Perhexyl Z | NOF Corporation | — | — | 2 | 2 | — |
|  | Rosin Derivative | KE-311 | Arakawa Chemical Industries, Ltd. | — | — | — | — | — |
|  | Aromatic Modified Terpene | YS Resin T105 | Yasuhara Chemical Co., Ltd. | — | — | — | — | — |
|  | AcrylicAcrylate | NK Polymer P1002S | Shin Nakamura Chemical Co., Ltd. | — | — | — | — | — |
|  | UrethaneAcrylate | U-200AX | Shin Nakamura Chemical Co., Ltd. | — | — | — | — | — |
|  | Plastic Epoxy Resin | EP4010S | Adeka Corporation | — | — | — | — | — |
| Thickness of First Insulating Resin Layer (μm) | | | | 6 | 6 | 6 | 6 | 6 |
| Thickness of Second Insulating Resin Layer (μm) | | | | 12 | 12 | 12 | 12 | 10 |
| Thickness of Third Insulating Resin Layer (μm) | | | | 3 | 3 | 3 | 3 | 5 |
| Tack Force (kPa) | | | | More than 3 | More than 3 | More than 3 | More than 3 | More than 3 |
| Adhesion Strength (N) | | | | 1450 | 1550 | 1350 | 1500 | 1600 |
| Initial Conduction (Ω) | | | | 0.2 | 0.2 | 0.2 | 0.2 | 0.2 |
| Conduction Reliability (Ω) | | | | 3.2 | 2.5 | 3 | 2.4 | 3 |
| Short Circuit Occurrence Ratio (ppm) | | | | 50 | 50 | 50 | 50 | 50 |

|  |  |  |  | Example |  |  |  |  |
|---|---|---|---|---|---|---|---|---|
|  |  |  |  | 13 | 14 | 15 | 16 | 17 |
| First Insulating Resin Layer | Phenoxy Resin | YP-50 | Nippon Steel & Sumikin Chemical Co., Ltd. | 80 | 80 | 80 | 80 | 80 |
|  | Acrylate | EB600 | Daicel-Alhex Ltd. | 20 | 20 | 20 | 20 | 20 |
|  | Photo-Radical Polymerization Initiator | IRGACURE 369 | BASF Japan Ltd. | 2 | 2 | 2 | 2 | 2 |
|  | Thermal Cationic Polymerization Initiator | SI-60L | Sanshin Chemical Industry Co., Ltd. | 2 | 2 | 2 | 2 | 2 |
|  | Conductive Particle | AUL704 | Sekisui Chemical Co., Ltd. | Single-Layer Arrangement | | | | |
| Second Insulating Resin Layer | Phenoxy Resin | YP-50 | Nippon Steel & Sumikin Chemical Co., Ltd. | 60 | 60 | 60 | 60 | 60 |
|  | Epoxy Resin | jER828 | Mitsubishi Chemical Corporation | 40 | 40 | 40 | 40 | 40 |
|  | Thermal Cationic Polymerization Initiator | SI-60L | Sanshin Chemical Industry Co., Ltd. | 2 | 2 | 2 | 2 | 2 |
| Third Insulating Resin Layer | Phenoxy Resin | YP-50 | Nippon Steel & Sumikin Chemical Co., Ltd. | 60 | 50 | 50 | 50 | 50 |
|  | Epoxy Resin | YL980 | Mitsubishi Chemical Corporatian | — | — | — | 40 | — |
|  | Thermal Cationic Polymerization Initiator | SI-60L | Sanshin Chemical Industry Co., Ltd. | — | — | — | — | — |
|  | Acrylate | M-215 | Toagosei Co., Ltd. | 40 | 40 | 40 | — | 40 |
|  | Organic Peroxide | Perhexyl Z | NOF Corporation | 2 | 2 | 2 | 2 | 2 |
|  | Rosin Derivative | KE-311 | Arakawa Chemical Industries, Ltd. | — | 10 | — | — | — |
|  | Aromatic Modified Terpene | YS Resin T105 | Yasuhara Chemical Co., Ltd. | — | — | 10 | 10 | — |
|  | AcrylicAcrylate | NK Polymer P1002S | Shin Nakamura Chemical Co., Ltd. | — | — | — | — | 10 |
|  | UrethaneAcrylate | U-200AX | Shin Nakamura Chemical Co., Ltd. | — | — | — | — | — |
|  | Plastic Epoxy Resin | EP4010S | Adeka Corporation | — | — | — | — | — |
| Thickness of First Insulating Resin Layer (μm) | | | | 6 | 6 | 6 | 6 | 6 |
| Thickness of Second Insulating Resin Layer (μm) | | | | 12 | 12 | 12 | 10 | 12 |
| Thickness of Third Insulating Resin Layer (μm) | | | | 5 | 3 | 3 | 3 | 3 |
| Tack Force (kPa) | | | | More than 3 | More than 10 | More than 10 | More than 10 | More than 10 |
| Adhesion Strength (N) | | | | 1700 | 1400 | 1500 | 1450 | 1450 |
| Initial Conduction (Ω) | | | | 0.2 | 0.2 | 0.2 | 0.2 | 0.2 |

TABLE 2-continued

| | | | | | | | | |
|---|---|---|---|---|---|---|---|---|
| Conduction Reliability (Ω) | | | | | 2.4 | 3.5 | 3.2 | 3.1 | 3.4 |
| Short Circuit Occurrence Ratio (ppm) | | | | | 50 | 50 | 50 | 50 | 50 |

| | | | | | Example | | Comparative Example |
|---|---|---|---|---|---|---|---|
| | | | | | 18 | 19 | 2 |
| First Insulating Resin Layer | Phenoxy Resin | YP-50 | Nippon Steel & Sumikin Chemical Co., Ltd. | 80 | 80 | 80 |
| | Acrylate | EB600 | Daicel-Alhex Ltd. | 20 | 20 | 20 |
| | Photo-Radical Polymerization Initiator | IRGACURE 369 | BASF Japan Ltd. | 2 | 2 | 2 |
| | Thermal Cationic Polymerization Initiator | SI-60L | Sanshin Chemical Industry Co., Ltd. | 2 | 2 | 2 |
| | Conductive Particle | AUL704 | Sekisui Chemical Co., Ltd. | Single-Layer Arrangement | | |
| Second Insulating Resin Layer | Phenoxy Resin | YP-50 | Nippon Steel & Sumikin Chemical Co., Ltd. | 60 | 60 | 60 |
| | Epoxy Resin | jER828 | Mitsubishi Chemical Corporation | 40 | 40 | 40 |
| | Thermal Cationic Polymerization Initiator | SI-60L | Sanshin Chemical Industry Co., Ltd. | 2 | 2 | 2 |
| Third Insulating Resin Layer | Phenoxy Resin | YP-50 | Nippon Steel & Sumikin Chemical Co., Ltd. | 50 | 50 | — |
| | Epoxy Resin | YL980 | Mitsubishi Chemical Corporatian | — | 40 | — |
| | Thermal Cationic Polymerization Initiator | SI-60L | Sanshin Chemical Industry Co., Ltd. | — | — | — |
| | Acrylate | M-215 | Toagosei Co., Ltd. | 40 | — | — |
| | Organic Peroxide | Perhexyl Z | NOF Corporation | 2 | 2 | — |
| | Rosin Derivative | KE-311 | Arakawa Chemical Industries, Ltd. | — | — | — |
| | Aromatic Modified Terpene | YS Resin T105 | Yasuhara Chemical Co., Ltd. | — | — | — |
| | AcrylicAcrylate | NK Polymer P1002S | Shin Nakamura Chemical Co., Ltd. | — | — | — |
| | UrethaneAcrylate | U-200AX | Shin Nakamura Chemical Co., Ltd. | 10 | — | — |
| | Plastic Epoxy Resin | EP4010S | Adeka Corporation | — | 10 | — |
| Thickness of First Insulating Resin Layer (μm) | | | | 6 | 6 | 6 |
| Thickness of Second Insulating Resin Layer (μm) | | | | 10 | 10 | 12 |
| Thickness of Third Insulating Resin Layer (μm) | | | | 3 | 3 | — |
| Tack Force (kPa) | | | | More than 10 | More than 10 | Less than 3 |
| Adhesion Strength (N) | | | | 1400 | 1500 | 1100 |
| Initial Conduction (Ω) | | | | 0.2 | 0.2 | 0.2 |
| Conduction Reliability (Ω) | | | | 3.5 | 3.6 | 4 |
| Short Circuit Occurrence Ratio (ppm) | | | | 50 | 50 | 50 |

As seen from Table 2, the anisotropic conductive films of Examples 8 to 19 had excellent tack force and adhesion strength, and exhibited preferable results in practical terms in all evaluation items of initial conduction, conduction reliability, and short circuit occurrence ratio. The anisotropic conductive film of Example 20 had a conduction reliability slightly lower than that in Example 1, but did not have a problem in practical terms, and exhibited the same preferable results as in Example 1 in tack force, adhesion strength, initial conduction, and short circuit occurrence ratio.

On the other hand, the anisotropic conductive film of Comparative Example 1 had inferior tack force and adhesion strength.

INDUSTRIAL APPLICABILITY

The anisotropic conductive film of the first aspect of the present invention has a two-layer structure in which the first connection layer that is a photopolymerized resin layer and a thermo- or photo-cationically, anionically, or radically polymerizable resin layer are layered. In addition, the conductive particles for anisotropic conductive connection are arranged in a single layer on a surface of the first connection layer on a side of the second connection layer. Further, fine projections and recesses are formed on a surface of the first connection layer. For this reason, favorable temporary attachment properties and repairability are achieved without impairing conduction reliability and insulating properties. Therefore, the anisotropic conductive film is useful in anisotropic conductive connection of an electronic component such as an IC chip to a wiring substrate. The width of the wiring of such an electronic component has been decreased. When the present invention contributes to such technical advancement, the effects are particularly exerted.

In the anisotropic conductive film of the second aspect of the present invention, the first connection layer obtained by photopolymerizing a photopolymerizable resin layer and the second connection layer that is formed of a thermo-cationically or thermo-anionically polymerizable resin, a photo-cationically or photo-anionically polymerizable resin, a thermo-radically polymerizable resin, or a photo-radically polymerizable resin are layered, and the conductive particles are disposed in a single layer on a surface of the first connection layer on a side of the second connection layer. Therefore, excellent initial conduction, conduction reliability, and insulating properties (low short circuit occurrence ratio) due to favorable conductive particle capture ratio are shown. Further, the third connection layer having tackiness is layered on the first connection layer. Therefore, when the anisotropic conductive film is used for anisotropic conductive connection, the deformation of the anisotropic conductive film is suppressed, and the conductive particle capture ratio is further enhanced. Further, the adhesion strength of a connection structure anisotropically conductively connected is also increased. Therefore, the anisotropic conductive film of the present invention is useful in anisotropic conductive connection of an electronic component such as an IC chip to a wiring substrate. The width of the wiring of such an electronic component has been decreased. The present invention is particularly useful in anisotropic conductive connection of an electronic component having a decreased wiring width.

REFERENCE SIGNS LIST 1, 100 anisotropic conductive film
2, 12 first connection layer
2a, 2b, 12a, 12b surface of first connection layer
2c fine projections and recesses
2X, 2Y, 12X, 12Y region of first connection layer
3, 13 second connection layer
4, 14 conductive particle
15 third connection layer
10 layered body
20 first temporary connection layer
31, 201 photopolymerizable resin layer
40, 301, 310 release film
50 temporary anisotropic conductive film

The invention claimed is:

1. An anisotropic conductive film having a second connection layer layered on a surface of a first connection layer and a third connection layer layered on another surface of the first connection layer, wherein
the first connection layer is formed of a photopolymerized resin,
the second and third connection layers are each formed of a thermo-cationically or thermo-anionically polymerizable resin, a photo-cationically or photo-anionically polymerizable resin, a thermo-radically polymerizable resin, or a photo-radically polymerizable resin,
the third connection layer has a thickness of 3 μm,
the third connection layer is thinner than the first connection layer, and
the first connection layer has conductive particles for anisotropic conductive connection arranged in a single layer, the conductive particles being not embedded in the first connection layer.

2. The anisotropic conductive film according to claim 1, wherein the first connection layer has a thickness of 6 μm to 1 μm.

3. The anisotropic conductive film according to claim 1, wherein the third connection layer has a tack force larger than 3 kPa that is measured by a probe method.

4. A connection structure in which a first electronic component and a second electronic component are connected by anisotropic conductive connection through the anisotropic conductive film according to claim 1.

5. A method for manufacturing a connection structure comprising connecting a first electronic component to a second electronic component by anisotropic conductive connection through the anisotropic conductive film according to claim 1.

6. The anisotropic conductive film according to claim 1, wherein in the first connection layer, a curing ratio in a region where the conductive particles are present is lower than a curing ratio in a region where the conductive particles are not present.

7. The anisotropic conductive film according to claim 1, wherein the first connection layer is obtained by photo-radically polymerizing a photo-radically polymerizable resin layer containing an acrylate compound and a photo-radical polymerization initiator.

8. The anisotropic conductive film according to claim 7, wherein the first connection layer includes the remaining acrylate compound and photo-radical polymerization initiator.

9. The anisotropic conductive film according to claim 1, wherein the first connection layer contains an acrylate compound and a thermal radical polymerization initiator.

10. The anisotropic conductive film according to claim 1, wherein the first connection layer contains an epoxy compound and a thermo-cationic or thermo-anionic polymerization initiator or a photo-cationic or photo-anionic polymerization initiator.

11. The anisotropic conductive film according to claim 1, wherein the second connection layer is formed of a polymerizable resin containing an epoxy compound and a thermo-cationic or thermo-anionic polymerization initiator or a photo-cationic or photo-anionic polymerization initiator, or a polymerizable resin containing an acrylate compound and a thermo-radical or photo-radical polymerization initiator.

12. The anisotropic conductive film according to claim 1, wherein the third connection layer is formed of a polymerizable resin containing an epoxy compound and a thermo-cationic or thermo-anionic polymerization initiator or a photo-cationic or photo-anionic polymerization initiator, or a polymerizable resin containing an acrylate compound and a thermo-radical or photo-radical polymerization initiator.

* * * * *